United States Patent
Nealey et al.

(10) Patent No.: US 9,372,398 B2
(45) Date of Patent: Jun. 21, 2016

(54) PATTERNING IN THE DIRECTED ASSEMBLY OF BLOCK COPOLYMERS USING TRIBLOCK OR MULTIBLOCK COPOLYMERS

(75) Inventors: Paul Franklin Nealey, Madison, WI (US); Shengxiang Ji, Changchun (CN)

(73) Assignee: Wisconsin Alumni Research Foundation, Madison, WI (US)

( * ) Notice: Subject to any disclaimer, the term of this patent is extended or adjusted under 35 U.S.C. 154(b) by 875 days.

(21) Appl. No.: 13/543,667

(22) Filed: Jul. 6, 2012

(65) Prior Publication Data
US 2013/0230705 A1    Sep. 5, 2013

Related U.S. Application Data

(60) Provisional application No. 61/606,292, filed on Mar. 2, 2012.

(51) Int. Cl.
| | | |
|---|---|---|
| B32B 27/28 | (2006.01) | |
| B32B 33/00 | (2006.01) | |
| B05D 3/10 | (2006.01) | |
| G03F 7/00 | (2006.01) | |
| B81C 1/00 | (2006.01) | |

(52) U.S. Cl.
CPC .......... *G03F 7/0002* (2013.01); *B81C 1/00031* (2013.01); *B81C 2201/0149* (2013.01); *Y10T 428/24851* (2015.01)

(58) Field of Classification Search
CPC ................................................. B81C 2201/0149
See application file for complete search history.

(56) References Cited

U.S. PATENT DOCUMENTS

| | | | |
|---|---|---|---|
| 3,444,732 A | 5/1969 | McKinley et al. | |
| 4,235,657 A | 11/1980 | Greenman et al. | |
| 5,948,470 A | 9/1999 | Harrison et al. | |
| 6,146,755 A | 11/2000 | Guha et al. | |
| 6,162,532 A | 12/2000 | Black et al. | |
| 6,565,763 B1 | 5/2003 | Asakawa et al. | |
| 6,746,825 B2 * | 6/2004 | Nealey ................ | B82Y 30/00 369/100 |
| 6,893,705 B2 | 5/2005 | Thomas | |
| 6,926,953 B2 | 8/2005 | Nealey et al. | |
| 7,704,432 B2 | 4/2010 | Dumond et al. | |

(Continued)

FOREIGN PATENT DOCUMENTS

| | | |
|---|---|---|
| JP | 10-330494 | 12/1998 |
| JP | 2004-087531 | 3/2004 |

(Continued)

OTHER PUBLICATIONS

International Search Report and Written Opinion mailed on Nov. 26, 2013, issued in Application No. PCT/US2013/056792.

(Continued)

*Primary Examiner* — Ian Rummel
(74) *Attorney, Agent, or Firm* — Weaver Austin Villeneuve & Sampson LLP

(57) ABSTRACT

Provided herein are block copolymer thin film structures and methods of fabrication. The methods involve directing the assembly of ABA triblock copolymers such that desired features are formed by domains of the assembled ABA triblock copolymer. In some embodiments, an ABA triblock copolymer is directed to assemble by a chemical pattern. Chemical patterns with periods much different than the natural period of the ABA triblock copolymer may be used to direct assembly of the ABA triblock copolymer.

19 Claims, 13 Drawing Sheets

(56) References Cited

U.S. PATENT DOCUMENTS

| | | | |
|---|---|---|---|
| 7,763,319 | B2 | 7/2010 | Cheng et al. |
| 7,901,607 | B2 | 3/2011 | Xu et al. |
| 7,959,975 | B2 | 6/2011 | Millward |
| 8,133,341 | B2 | 3/2012 | Nealey et al. |
| 8,133,534 | B2 | 3/2012 | Stoykovich et al. |
| 8,168,284 | B2 | 5/2012 | Nealey et al. |
| 8,287,957 | B2 | 10/2012 | Nealey et al. |
| 8,501,304 | B2 | 8/2013 | Stoykovich et al. |
| 8,618,221 | B2 | 12/2013 | Nealey et al. |
| 8,623,493 | B2 | 1/2014 | Nealey et al. |
| 2002/0132083 | A1 | 9/2002 | Weller et al. |
| 2003/0091752 | A1 | 5/2003 | Nealey et al. |
| 2003/0091865 | A1 | 5/2003 | Chen et al. |
| 2004/0091748 | A1 | 5/2004 | Kamata et al. |
| 2004/0143063 | A1 | 7/2004 | Chen et al. |
| 2004/0174257 | A1 | 9/2004 | Kuhns et al. |
| 2006/0134556 | A1 | 6/2006 | Nealey et al. |
| 2007/0092721 | A1 | 4/2007 | Kishimoto |
| 2007/0095469 | A1 | 5/2007 | Burdinski |
| 2008/0075978 | A1 | 3/2008 | Weller et al. |
| 2008/0233435 | A1 | 9/2008 | Hasegawa et al. |
| 2008/0257187 | A1 | 10/2008 | Millward |
| 2008/0299353 | A1 | 12/2008 | Stoykovich et al. |
| 2009/0087653 | A1 | 4/2009 | Nealey et al. |
| 2009/0087664 | A1 | 4/2009 | Nealey et al. |
| 2009/0196488 | A1 | 8/2009 | Nealey et al. |
| 2009/0260750 | A1 | 10/2009 | Nealey et al. |
| 2009/0274887 | A1* | 11/2009 | Millward et al. ............. 428/221 |
| 2010/0255268 | A1 | 10/2010 | Choi et al. |
| 2010/0316849 | A1 | 12/2010 | Millward et al. |
| 2011/0104452 | A1 | 5/2011 | Grozea et al. |
| 2012/0164392 | A1 | 6/2012 | Stoykovich et al. |
| 2012/0189824 | A1 | 7/2012 | Nealey et al. |
| 2012/0202017 | A1 | 8/2012 | Nealey et al. |
| 2013/0189504 | A1 | 7/2013 | Nealey et al. |
| 2013/0230705 | A1 | 9/2013 | Nealey et al. |
| 2014/0010990 | A1 | 1/2014 | Nealey et al. |
| 2014/0065379 | A1 | 3/2014 | Nealey et al. |
| 2014/0087142 | A1 | 3/2014 | Nealey et al. |

FOREIGN PATENT DOCUMENTS

| | | |
|---|---|---|
| JP | 2004/099667 | 4/2004 |
| JP | 2005-502916 | 1/2005 |
| JP | 2005-502917 | 1/2005 |
| JP | 2007/138052 | 6/2007 |
| JP | 2007/111215 | 12/2007 |
| JP | 2007313568 | 12/2007 |
| JP | 2007/125699 | 12/2009 |
| JP | 2011-080379 | 4/2011 |
| WO | 03/023517 | 3/2003 |
| WO | 2006/112887 | 6/2006 |
| WO | 2009/146068 | 12/2009 |
| WO | 2009/146086 | 12/2009 |

OTHER PUBLICATIONS

Office Action mailed Nov. 24, 2014, for U.S. Appl. No. 13/367,337.

Hanley, et al., Phase Behavior of a Block Copolymer in Solvents of Varying Selectivity, *Macromolecules* Jul. 7, 2000, vol. 33, pp. 5918-5931.

Ho et al., "Solvent-induced microdomain orientation in polystyrene-b-poly(L-lactide) diblock copolymer thin films for nanopatterning," Polymer, vol. 46, (2005), pp. 9362-9377.

Kim, et al., "High Oriented and ordered Arrays from Block Copolymers Via Solvent Evaporation," Adv. Mater., vol. 16, No. 3, Feb. 3, 2004, pp. 226-231.

Kim, et al., "Solvent-Induced Ordering in Thin Film Diblock Copolymer/Homopolyer Mixtures," Adv. Mater., vol. 16, No. 23-24, Dec. 17, 2004, pp. 2119-2123.

Kim, et al., Morphological Development in Solvent-Cast Polystyrene-Polybutadiene-Polystyrene (SBS) Triblock Copolymer Thin Films, Macromolecules, vol. 31, Mar. 31, 1998, pp. 2369-2577.

Lin, et al., "A Rapid Route to Arrays of Nanostructures in Thin Films," Adv. Mater., vol. 14, No. 19, Oct. 2, 2002, pp. 1373-1376.

Lodge, et al., "Phase Behavior of Block Copolymers in a Neutral Solvent," Macromolecules, vol. 36, No. 3, Jan. 3, 2003, pp. 816-822.

Mori, et al, "Order-disorder transition of polystyrene-block-polyisoprene Part II. Characteristic length as a function of polymer concentration, molecular weight, copolymer composition, and x parameter," Polymer, vol. 42, 2001, pp. 3009-3021.

Shibayama, et al., Ordered Structure in Block Polymer Solutions. 3. Concentration Dependence of Microdomains in Nonselective Solvents, J. Am. Chem. Soc., Vo. 16, 1983, pp. 1427-1433.

Sidorenko, et al., "Ordered Reactive Nanomembranes/Nanotemplates from Thin Films of Block Copolymer Supramolecular Assembly," J. Am. Chem. Soc., vol. 125, 2003, pp. 1221-12216.

Office Action mailed Mar. 25, 2015, for U.S. Appl. No. 13/619,525.

Feng, et al., "Monte Carlo Simulation of Triblock Copolymer thin Films," Polymer, vol. 43, Jul. 6, 2002, pp. 5775-5790.

Ramirez-Hernandez, A., et al., "Symmetric Diblock Copolymers Con ned by Two Nanopatterned Surfaces," Department of Chemical and Biological Engineering, University of Wisconsin-Madison, Madison, Wisconsin 53706, Sep. 6, 2011, 10 pages.

Office Action mailed Mar. 27, 2015 for U.S. Appl. No. 12/329,484.

Asakawa et al. (2002) Nanopatterning with Microdomains of Block Copolymers using Reactive-Ion Etching Selectivity, *Jpn. J. Appl. Phys.* vol. 41 (2002) pp. 6112-6118.

Bates et al. (1990) Block Copolymer Thermodynamics: Theory and Experiment, *Annu. Rev. Phys. Chem.*, 1990, 41: pp. 525-557.

Bates et al. (1995) Isotropic Lifshitz Behavior in Block Copolymer-Homopolymer Blends, *Phy. Rev. Ltrs.*, vol. 75, No. 24, Dec. 11, 1995.

Bates et al. (1997) Polymeric Bicontinuous Microcmulsions, *Phy. Rev. Ltrs.*, vol. 69, No. 5, Aug. 4, 1997.

Bates, et al., "Block Copolymers—Designer Soft Materials," *Physics Today*, Feb. 1999, vol. 52, No. 2, pp. 32-38.

Berreman et al. (1990) Use of trilevel resists for high-resolution soft-x-ray projection lithography, *Appl. Phys. Lett.* 56 (22), May 28, 1990, p. 2180.

Black et al. (2001) Integration of self-assembled diblock copolymers for semiconductor capacitor fabrication, *Applied Physics Letters*, vol. 79, No. 3, Jul. 16, 2001, pp. 409-411.

Black et al. (2004) High-Capacity, Self-Assembled Metal-Oxide-Semiconductor Decoupling Capacitors, *IEEE Electron Device Ltrs*, vol. 25, No. 9, Sep. 2004.

Black, C.T., et al, "Polymer Self Assembly in Semiconductor Microelectronics," IBM Journal of Research and Development, *International Business Machines Corporation*, New York, vol. 51, No. 5, Sep. 1, 2007, XP007905680, pp. 605-633.

Bohbot-Raviv, et al., "Discovering New Ordered Phases of Block Copolymers," *The American Physical Society*, vol. 85, No. 16, Oct. 16, 2000, 4 pages.

Boltau et al. (1998) Surface-induced structure formation of polymer blends on patterned substrates, *Nature*, vol. 391, Feb, 1998, p. 877.

Broseta et al. (1990) Phase equilibria in copolymer/homopolymer ternary blends: Molecular weight effects, *J. Chem. Phy.*, 93(4), Aug. 15, 1990.

Burgaz et al. (2000) T-Junction Grain Boundaries in Block Copolymer-Homopolymer Blends, *Macromolecules*, vol. 33, pp. 8739-8745.

Campbell et al. (2000) Fabrication of photonic crystals for the visible spectrum by holographic lithography, *Nature*, vol. 404, Mar. 2, 2000, p. 53.

Cardinale et al. (1999) Demonstration of pattern transfer into sub-100 nm polysilicon line/space features patterned with extreme ultraviolet lithography, *J. Va. Sci. Technol. B* vol. 17(6), Nov./Dec. 1999.

Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.

Chen et al. (1998) Morphology of thin block copolymer films on chemically patterned substrates, *Journal of Chemical Physics*, Apr. 22, 1998, vol. 108, No. 16, p. 6897.

Cheng et al (2001) Formation of a Cobalt Magnetic Dot Array viz Block.Copolymer Lithography, *Adv. Mater. 2001*, 13, No. 15 Aug 3, 2001, p. 1174-1178.

(56) References Cited

OTHER PUBLICATIONS

Cheng et al. (2002) Fabrication of nanostructures with long-range order using.block copolymer lithography, *Applied Physics Letters*, vol. 81, No. 19, Nov. 4, 2002, p. 3657-3659.

Cheng et al. (2003) Templated Self-Assembly of Block Copolymers: Effect of Substrate Topography, *Advanced Materials* 2003, vol. 15, No. 19, Oct. 2, pp. 1599-1602.

Corvazicr et al. (2001) Lamellar phases and microcmulsions in model ternary.blends containing amphiphilic block copolymers, *The Royal Society of Chemistry, J. Mater. Chem*, 2001, 11, pp. 2864-2874.

Coulon et al. (1989) Surface-Induced Orientation of Symmetric, Diblock Copolymers: A Secondary Ion Mass Spectrometry Study, *Macromolecules*, vol. 22, pp. 2581-2589.

Coulon et al. (1993) Time Evolution of the Free Surface of Ultrathin Copolymer Films, *Macromolecules*, vol. 26, pp. 1582-1589.

Craig, et al., "Self Assembly of Block Copolymers on Lithographically Defined Nano Patterned Substrate," *Journal of Photopolymer Science & Technology*, vol. 20, No. 4, Jun. 4, 2007, 7 pages.

Daoulas et al. (2006) Fabrication of Complex Three-Dimensional Nanostructures from Self-Assembling Block Copolymer Materials on Two-Dimensional Chemically Patterned Templates with Mismatched Symmetry, *Physical Review Letters*, Jan. 27, 2006, PRL 96, pp. 036104-1-036104-4.

Daoulas et al. (2006) Morphology of multi-component polymer systems: single chain in mean field simulation studies, The Royal Society of Chemistry, *Soft Matter*, 2006, vol. 2, pp. 573-583.

Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.

Daoulas, et al., "Directed Copolymer Assembly on Chemical Substrate patterns: A Phenomenological and Single-Chain-in-Main-Field Simulations Study of the Influence of Roughness in the Substrate Pattern," American Chemical Society, *Langmuir*, published Dec. 8, 2007, vol. 24, pp. 1284-1295.

Detcheverry, et al., Monte Carlo Simulation of Coarse Grain Polymeric Systems, *The American Physical Society*, May 15, 2009, PRL 102(19) 197801(4), pp. 197801-1-197801-4.

Detcheverry, et al., "Theoretically Informed Coarse Grain Simulations of Block Copolymer Melts: Method and Applications," *Soft Matter* 5 (24), 2008, 4868-4865.

Detcheverry, et al., "Stimulations of Theoretically Informed Course Grain Models of Polymeric Systems," *Faraday Discussions*, vol. 144, (2010) 111-125 (total 17 pages).

Detcheverry, et al., Monte Carlo Simulations of a Course Grain Model for Block Copolymers and Nanocomposites, published Jun. 11, 2008, vol. 41, pp. 4989-5001.

Düchs et al. (2003) Fluctuation Effects in Ternary AB+ A+ B Polymeric Emulsions, *Macromolecules* V36, pp. 9237-9248.

Düchs et al. (2004) Formation and structure of the microemulsion phase in two-dimensional ternary AB+A+B Polymeric emulsions, *Jnl of Chem Phy*, vol. 121, No. 6, Aug. 8, 2004, p. 2798.

Edwards, et al., Binary Blends of diblock Copolymers as an Effective route to Multiple, Length Scales in Perfect Directed Self-Assembly of Diblock Copolymer Thin Films, *J. Vac. Sci., Technol.*, vol. 24, No. 1, Jan./Feb. 2006, pp. 340-344.

Edwards et al. (2004) Precise Control over Molecular Dimensions of Block-Copolymer Domains Using the Interfacial Energy of Chemically Nanopatterned Substrates, *Advanced Materials*, 2004, vol. 16, No. 15, Aug. 4, pp. 1315-1319.

Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.

Edwards, et al., "Long-Range Order and Orientation of Cylinder-Forming Block Copolymers on Chemically Nanopatterned Striped Surfaces," American Chemical Society, *Macromolecules*, published Apr. 13, 2006, vol. 39, pp. 3598-3607.

Edwards, et al., "Mechanism and Kinetics of Ordering in Diblock Copolymer Thin Films on Chemically Nanopatterned Substrates," *Journal of Polymer Science:* Part B, Polymer Physics, 2005, vol. 43, pp. 3444-3459.

Ekinci, et al., "20 nm Line/Space Patterns in HSQ Fabricated by EUV Interference Lithography," Photon Lithography, MNE 2006 Micro- and Nano-Engineering, 2 pages.

Fasolka et al. (2000) Morphology of Ultrathin Supported Diblock Copolymer Films: Theory and Experiment, *Macromolecules* vol. 33, pp. 5702-5712.

Floudas et al. (1997) Microphase separation in block copolymer/homopolymer blends: Theory and experiment, *J. Chem. Phys.* 106 (8), Fe. 22, 1997, p. 3318.

Fukukawa et al. (2005) Synthesis and Characterization of Silicon-Containing Block Copolymers from Nitroside-Mediated Living Free Radical Polymerization, *Macromolecules* vol. 38, pp. 263-270.

Galatsis, K., et al., Patterning and Templating for Nanoelectronics, *Advanced Materials*, 2010, vol. 22, pp. 769-778.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.

Han, et al., Perpendicular Orientation of Domains in Cylinder-Forming Block Copolymer Thick Films by Controlled Interfacial Interactions, American Chemical Society, *Macromolecules* Article, Published Jun. 11, 2009, vol. 42, pp. 4896-4901.

Helfand et al. (1972) Theory of the Interface between Immiscible Polymers, II, *Journal of Chemical Physics*, vol. 56, No. 7, Apr. 1, 1972, pp. 3592-3601.

Hillmyer et al. (1991) Model Bicontinuous Microemulsions in Ternary Homopolymer/Block Copolymer Blends, *J. Phy. Chem.* B 1999, 103, pp. 4814-4824.

Hirai, et al., "One-Step Direct-Patterning Template Utilizing Self-Assembly of POSS-Containing Block Copolymers," *Adv. Mater.*, 2009, vol. 21, pp. 4334-4338.

Hong, A., et al., "Metal Nanodot Memory by Self-Assembled Block Copolymer Lift-Off," *American Chemical Society*, Nano Left 2010, vol. 10, pp. 224-229.

Huang et al. (1991) Modeling Copolymer Adsorption on Laterally Heterogeneous Surfaces, *Physical Review Letters*, Feb. 4, 1991, vol. 66, No. 5, p. 620.

In, et al., Side-Chain-Grafted Random Copolymer Brushes as Neutral Surfaces for Controlling the Orientation of Block Copolymer Microdomains in Thin Films, American Chemical Society, *Langmuir*, published Aug. 1, 2006, vol. 22, pp. 7855-7860.

Jeong et al. (2002) Asymmetric Block Copolymers with Homopolymers: Routes to Multiple Length Scale nanostructures, *Adv. Mater.* 2002., 14, No. 4, Feb. 19, 2002, p. 274.

Jeong et al. (2003) Precise Control of Nanopore Size in Thin Film Using Mixtures of Asymmetric Block Copolymer and Homopolymer, *Macromolecules* 2003, 36, pp. 10126-10129.

Ji, et al., "Generalization of the Use of Random Copolymers to Control the Wetting Behavior of Block Copolymer Films," American Chemical Society, published Nov. 11, 2008, vol. 41, pp. 9098-9103.

Ji, et al., "Preparation of Neutral Wetting Brushes for Block Copolymer Films from Homopolymer Blends," *Advanced Materials*, 2008 vol. 20, pp. 3054-3060.

Ji, Shengxiang, et al., "Molecular Transfer Printing Using Block Copolymers," *ACS Nano* vol. 4, No. 2, 2010, pp. 599-609.

Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.

Kang, et al., "Hierarchical Assembly of Nanoparticle Superstructures from Block Copolymer-Nanoparticle Composites," published Apr. 9, 2008, vol. 100(4), pp. 148303-1-148303-4.

Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.

Kim et al. (2000) Chemical Modification of Self-Assembled Monolayers by Exposure to Soft X-rays in *Air, J. Phys. Chem.*, vol., 104, No. 31, 2000, pp. 7403-7410.

(56) References Cited

OTHER PUBLICATIONS

Kim et al. (2003) Epitaxial self-assembly of block copolymers on lithographically defined nanopatterned substrates, *Nature*, vol. 424, Jul. 24, 2003, *Nature* Publishing Group, pp. 411-414.

Kim, et al., "Defect Structure in Thin Films of a Lamellar Block Copolymer Self-Assemble on Neutral Homogeneous and Chemically Nanopatterned Surfaces," American Chemical Society, *Macromolecules*, published Jul. 13, 2006, vol. 39, 5466-5470.

Kim, et al., "Synthesis of Photoacid Generator-Containing Patternable Diblock Copolymers by Reversible Addition—Fragmentation Transfer Polymerization," Chemistry of Materials, *American Chemical Society*, Jul. 6, 2009, pp. 3030-3032.

Krishnan et al. (2001) Shear-Induced Nano-Macro Structural Transition in a Polymeric Bicontinuous Microcmulsion, *Phy Rev Ltrs*, vol. 87, No. 9, Aug. 27, 2001, p. 098301-1.

La, et al., "Directed Assembly of Cylinder-Forming Block Copolymer Films and Thermochemically Induced Cylinder to Sphere Transition: A Hierarchical Route to Linear Arrays of Nanodots," Nano Letter 2005, published May 28, 2005, *American Chemical Society*, vol. 5, No. 7, pp. 1379-1384.

La, et al, "Directed Assembly of Cylinder-Forming Block Copolymers into Patterned Structures to Fabricate Arrays of Spherical Domains and Nanoparticles," *Chemistry of Materials*, 2007:19(18), pp. 4538-4544.

Li et al. (2000) Dense arrays of ordered GaAs nanostructures by selective area growth on substrates patterned by block copolymer lithography, *Applied Physics Letters*, vol. 76, No. 13, Mar. 27, 2000, pp. 1689-1691.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Mansky et al. (1997) Ordered Diblock Copolymer Films on Random Copolymer Brushes, Macromolecules 1997, 30, pp. 6810-6813.

Mansky et al. (2006) Controlling Polymer-Surface Interactions with Random Copolymer Brushes, 1997, vol. 275, pp. 1458-1460.

Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.

Morkved et al. (1999) Dynamics of ternary polymer blends: Disordered, ordered and bicontinouous microemulsion phases, Faraday Discuss., 1999, 112, pp. 335-350.

Morkved et al. (2001) Static and Dynamic Scattering from Ternary Polymer Blends: Bicontinuous Microemulsions, Lifshitz lines, and amphiphilicity, *Jnl of Chem Phy*, V.114, No. 16, Apr. 22, 2001, p. 7247.

Morin, et al., "Assembly of Nanocrystal Arrays by Block-Copolymer-Directed Nucleation," *Angew. Chem. Inc.*, Ed. 2009, vol. 48, pp. 2135-2139.

Mortensen et al. (2000) Ternary mixture of homopolymer blend and diblock copolymer studied near the Lifshitz composition by small-angle neutron scattering, *J. Appl. Cryst.*, 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans.on Magnetics*, vol. 38, No. 5, Sep. 2002, p. 1949.

Nakano, et al., Single-Step Single-Molecule PCR of DNA with a Homo-Priming Sequence Using a Single Primer and Hot-Startable DNA Polymerase, *Journal of Bioscience and Bioengineering*, 2000, vol. 90 No. 4, pp. 456-458.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of $\sim 10^{11}$ Holes in 1 Square Centimeter, *Science*, vol. 276, May 30, 1997, pp. 1401-1404.

Park et al. (2003) Enabling nanotechnology with self assembled block copolymer patterns, *Polymer*, vol. 44 (2003) pp. 6725-6760; www.sciencedirect.com.

Park, et al., "Characterization of Cylinder-Forming Block Copolymers Directed to Assemble on Spotted Chemical Patterns," *American Chemical Society, Macromolecules*, Published Nov. 4, 2008, vol. 41, No. 23, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing a Diblock Copolymer Template," *IEEE* 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Park, et al., "Nano-Scale Selective Growth and Optical Characteristics of Quantum Dots on III-V Substrates Prepared by Diblock Copolymer Nano-Patterning," Journal of Nanophotonics, 3 (1), 031604, Jan. 30, 2009, pp. 1-12.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27, 2009, vol. 131, pp. 084903-1to 084903-10.

Preliminary Examination Report dated May 30, 2007 issued in PCTUS2005/042568.

Rockford et al. (1999) Polymers on Nanoperiodic, Heterogeneous Surfaces, *Phy. Rev. Ltrs, The American Physical Society*, vol. 82, No. 12, pp. 2602-2605.

Ruiz, et al., "Density Multiplication and Improved Lithography by Directed block Copolymer Assembly," Science, vol. 321, Aug. 15, 2008, pp. 936-939.

(56) References Cited

OTHER PUBLICATIONS

Russell et al. (1989) Characteristics of the Surface-Induced Orientation for Symmetric Diblock PS/PMMA Copolymers, *Macromolecules*, vol. 22, pp. 4600-4606.
Schattenburg et al. (1995) Optically matched trilevel resist process for nanostructure fabrication, *J. Vac. Sci. Technol. B*, 15(6), Nov./Dec. 1995, p. 3007.
Schwahn et al. (1999) Crossover from 3D Ising to Isotropic Lifshitz Critical Behavior in a Mixture of a Homopolymer Blend and Diblock Copolymer, *Phy. Rev. Ltrs, The American Physical Society*, vol. 82, No. 25, Jun. 21, 1999, p. 5056.
Schwahn et al. (2000) Thermal Composition fluctuations near the isotropic Lifshitz critical point in a Ternary mixture of a homopolymer blend and diblock copolymer, *Jnl. Chem. Phy.*, vol. 112 , No. 12, Mar. 22, 2000, p. 5454.
Solak, et al., "Sub-50 nm Period Patterns With EUV Interference Lithography," *Microelectronic Engineering* 67-68 (2003) 56-62.
Solak, Harun H. (2006) Nanolithography with coherent extreme ultraviolet light, *Jnl. of Physics D: App. Phys.*, 39 (2006) R171-R188.
Son, et al., "Placement Control of Nanomaterial Arrays on the Surface-Reconstructed Block Copolymer Thin Films," *ACSNano*, vol. 3, No. 12, 2009, pp. 3927-3934.
Son, et al., "Surfactant-Assisted Orientation of Thin Diblock Copolymer films," *Advanced Materials*, 2008, vol. 20, pp. 3643-3648.
Stoykovich et al. (2005) Directed Assembly of Block Copolymer Blends into Nonregular Device-Oriented Structures, *Science*, vol. 308, No. 5727, Jun. 3, 2005, www.sciencemag.org, pp. 1442-1446.
Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).
Stoykovich, M.P., et al, "Block Copolymers and Conventional Lithography," *Materials Today*, Elsevier Science, Kidlington, GB, vol. 9, No. 9, Sep. 1, 2006, pp. 20-29.
Stoykovich, M.P., et al, "Remediation of Line Edge Roughness in Chemical Nanopatterns by the Directed Assembly of Overlying Block Copolymer Films," *Macromolecules, American Chemical Society*, vol. 43, Feb. 10, 2010, pp. 2334-2342.
Stoykovich, Mark P., et al., "Methods and Compositions for Forming Patterns With Isolated or Discrete Features Using Block Copolymer Materials," U.S. Appl. No. 11/879,758, filed Jul. 17, 2007.
Stuen, et al., In situ Characterization of Block Copolymer Ordering on Chemically Nanopatterned Surfaces by time-resolved small angle X-ray Scattering, *J. Vac. Sci. Technol.* vol. 26(6), published Dec. 1, 2008, pp. 2504-2508.
Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.
Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.
Suh, Hyo Seon, et al., "Orientation of Block Copolymer Resists on Interlayer Dielectrics with Tunable Surface Energy," *American Chemical Society*, vol. 43, Nov. 13, 2009, pp. 461-466.
Teubner et al. (1987) Origin of the Scattering Peak in Microemulsions, *J. Chem. Phys.*, 87(5), Sep. 1, 1997, p. 3195.
Thurn-Albrecht et al. (2000) Nanoscopic Templates from Oriented Block Copolymer Films, Communications, *Advanced Materials*, vol. 12, No. 11, pp. 787-791.
Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.
Ting, et al., "Plasma Etch Removal of Poly (methyl methacrylate) in Block Copolymer Lithography," *J. Vac. Sci. Technol.*, vol. 26(5), Sep./Oct. 2008, pp. 1684-1689.
Torikai et al. (1997) Lamellar Domain Spacings of Diblock Copolymer/Homopolymer Blends and Conformations of Block Chains in Their Microdomains, *Macromolecules*, 30, pp. 5698-5703.

Urbas et al. (2000) Tunable Block Copolymer/Homopolymer Photonic Crystals, *Advanced Materials*, vol. 12, No. 11 p. 812.
Urbas et al. (2002) Bicontinuous Cubic Block Copolymer Photonic Crystals, *Advanced Materials*, vol. 14, No. 24, Dec. 17, 2002, p. 1850.
Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.
Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.
Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.
Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.
Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.
Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.
Wang, et al., Monte Carlo Simulations of Diblock Copolymer Thin Films Confined Between two Homogeneous Surfaces, Journal of Chemical Physics, Jan. 1, 2000, 112(1): 450-464.
Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.
Welander, et al., "Rapid Directed Assembly of Block Copolymer Films at Elevated Temperatures," *American Chemical Society*, Macromolecules, vol. 41, Published Apr. 1, 2008, pp. 2759-2761.
Whitesides et al. (1991) Molecular self-Assembly and Nanochemistry: A Chemical Strategy for the Synthesis of Nanostructures, Articles, *Science* vol. 254, p. 1312, Nov. 29, 1991.
Whitesides et al. (2002) Self-Assembly at All Scales, *Science, AAAS*, 295, p. 2418.
Xiao, et al., "Graphoepitaxy of Cylinder-forming Block Copolymers for Use as Templates to Pattern Magnetic Metal Dot Arrays," Institute of Physics Publishing, *Nanotechnology*, vol. 16, No. 7, 2005, pp. S324-S329.
Xu et al. (2001) The Influence of molecular weight on nanoporous polymer films, *Polymer*, 42 (2001) pp. 9091-9095; www.elsevier.com/locate/polymer.
Yang et al. (2000) Guided Self-Assembly of Symmetric Diblock Copolymer Films on Chemically Nanopatterned Substrates, *Macromolecules 2000*, 33, pp. 9575-9582.
Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.
Yang, et al., "Patterning of Self-Assembled Monolayers with Lateral Dimensions of 0.15 um Using Advanced Lithography," *J. Vac Sci. Technol.*, vol. 17(6), Nov./Dec. 1999, pp. 3203-3207.
Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.
International Search Report and Written Opinion of the International Searching Authority mailed Aug. 24, 2009, Application No. PCT/US2008/085742, 14 pages.
International Search Report and Written Opinion of the International Searching Authority mailed Dec. 16, 2009, Application No. PCT/US2009/039208.
U.S. Office Action mailed Jul. 31, 2009, from U.S. Appl. No. 11/286,260.
U.S. Office Action mailed Jan. 25, 2010, from U.S. Appl. No. 11/286,260.

(56) References Cited

OTHER PUBLICATIONS

International Search Report and Written Opinion dated May 2, 2007 issued in WO2006112887.
U.S. Office Action mailed Apr. 3, 2009, from U.S. Appl. No. 11/545,060.
U.S. Office Action mailed Nov. 30, 2009, from U.S. Appl. No. 11/545,060.
U.S. Office Action mailed Dec. 2, 2009, from U.S. Appl. No. 11/580,694.
U.S. Office Action mailed Jul. 23, 2009, from U.S. Appl. No. 11/879,758.
U.S. Final Office Action mailed Mar. 8, 2010, from U.S. Appl. No. 11/879,758.
U.S. Office Action mailed Jun. 25, 2010, from U.S. Appl. No. 11/286,260.
U.S. Office Action mailed Jul. 12, 2010, from U.S. Appl. No. 11/545,060.
U.S. Final Office Action mailed Jun. 10, 2010, from U.S. Appl. No. 11/580,694.
Todo et al., "Domain-Boundary Structure of Styrene-Isoprene Block Copolymer Films Cast From Solutions .III. Preliminary-Results on Spherical Microdomains," *Polymer Engineering and Science,* 17 (8): 587-597 1977.
Morkved et al., "Local control of microdomain orientation in diblock copolymer thin films with electric fields," Science, 273 (5277): 931-933 Aug. 16, 1996, pp. 931-933.
Kim, S.H., et al., "Highly oriented and ordered arrays from block copolymers via solvent evaporation," Advanced Materials, Feb. 3, 2004, 16 (3), pp. 226-231.
Fasolka, MJ, et al., Block copolymer thin films: Physics and applications, Annual Review of Materials Research, 2001, 31, pp. 323-355.
Tanaka, H, et al., "Ordered Structure in Mixtures of a Block Copolymer and Homopolymers . 1. Solubilization of Low-Molecular-Weight Homopolymers," Macromolecules, 24 (1), Jan. 7, 1991, pp. 240-251.
Hamley, et al., Nanostructure fabrication using block copolymers, *Nanotechnology,* Oct. 2003, 14 (10), pp. R39-R54.
Segalman, RA, et al., "Graphoepitaxy of spherical domain block copolymer films," Advanced Materials, Aug. 3, 2001, 13 (15) pp. 1152-1155.
U.S. Office Action mailed Dec. 27, 2010, from U.S. Appl. No. 11/545,060.
Office Action mailed Oct. 7, 2010 for U.S. Appl. No. 12/416,816.
U.S. Final Office Action mailed Dec. 13, 2010, from U.S. Appl. No. 11/286,260.
U.S. Office Action mailed Mar. 15, 2011, from U.S. Appl. No. 11/545,060.
U.S. Office Action mailed Dec. 17, 2010, from U.S. Appl. No. 11/545,060.
Office Action mailed Apr. 20, 2011 for U.S. Appl. No. 12/416,816.
Office Action mailed Apr. 21, 2011 for U.S. Appl. No. 12/329,484.
Watanabe, et al., "Smart Block Copolymer Masks With Molecule-Transport Channels for Total Wet Nanopatterning," J. Mater. Chem, 2008, vol. 18, 5482-5491.
Final Office action mailed Jul. 8, 2011, U.S. Appl. No. 11/879,758.
Final Office Action mailed Oct. 14, 2011 for U.S. Appl. No. 12/329,484.
Final Office Action mailed Aug. 31, 2011 for U.S. Appl. No. 12/416,816.
Final Office Action mailed Sep. 1, 2011, from U.S. Appl. No. 11/545,060.
Supplemental European Search Report mailed Oct. 26, 2011, from U.S. Appl. No. 05857837.8.
Notice of Allowance mailed Nov. 2, 2011 for U.S. Appl. No. 12/416,816.
Notice of Allowance mailed Nov. 4, 2011 for U.S. Appl. No. 11/879,758.
Notice of Allowance mailed Dec. 21, 2011, for U.S. Appl. No. 11/545,060.
Japanese Office Action mailed Jul. 3, 2012, Application No. 2007-543480.
Nealey, Paul Franklin, "Improved Patterning in the Directed Assembly of Block Copolymers Using Triblock or Multi-Block Copolymers," U.S. Appl. No. 13/543,667, filed Jul. 6, 2012.
Office Action mailed Apr. 11, 2012 for U.S. Appl. No. 12/329,484.
Office Action mailed Aug. 15, 2012 for U.S. Appl. No. 13/436,341.
Facsko, et al., Formation of Ordered Nanoscale Semiconductor Dots by Ion Sputtering, Science, vol. 285, Sep. 3, 1999 pp. 1551-1553.
Kim, S., et al, "Decoupling Bulk Thermodynamics and Wetting Characteristics of Block Copolymer Thin Films," ACS Macro Lett., American Chemical Society, pp. 11-14.
Notice of Allowance mailed Jun. 7, 2012, for U.S. Appl. No. 11/286,260.
U.S. Office Action mailed Oct. 15, 2012, from U.S. Appl. No. 11/580,694.
U.S. Office Action mailed Sep. 24, 2012, from U.S. Appl. No. 13/366,134.
Final Office Action mailed Dec. 18, 2012, for U.S. Appl. No. 12/329,484.
Notice of Allowance mailed Apr. 5, 2013, from U.S. Appl. No. 13/366,134.
Ho, Chih-Shing, "Precision of Digital Vision Systems," IEEE Transaction on Pattern Analysis and Machine Intelligence, vol. PAMI-5, No. 6, Nov. 1983, pp. 593-601.
International Search Report and Written Opinion mailed Dec. 5, 2012.
Final Office Action mailed May 31, 2013, from U.S. Appl. No. 11/580,694.
Notice of Allowance mailed Sep. 6, 2013, from U.S. Appl. No. 11/580,694.
Office Action mailed Jul. 12, 2013 for U.S. Appl. No. 12/329,484.
Notice of Allowance mailed Sep. 5, 2013 for U.S. Appl. No. 13/436,341.
Final Office Action mailed May 8, 2014 for U.S. Appl. No. 12/329,484.
Notice of Allowance mailed Jun. 29, 2015 for U.S. Appl. No. 12/329,484.
Final Office Action mailed Jul. 16, 2015, for U.S. Appl. No. 13/367,337.
Albert, et al., "Self-Assembly of Block Copolymer Thin Films," Materials Today, Jun. 2010, vol. 13, No. 6, 24-33.
Office Action mailed Sep. 10, 2015 for U.S. Appl. No. 13/543,681.
Office Action mailed Aug. 26, 2015 for U.S. Appl. No. 13/601,460.

\* cited by examiner

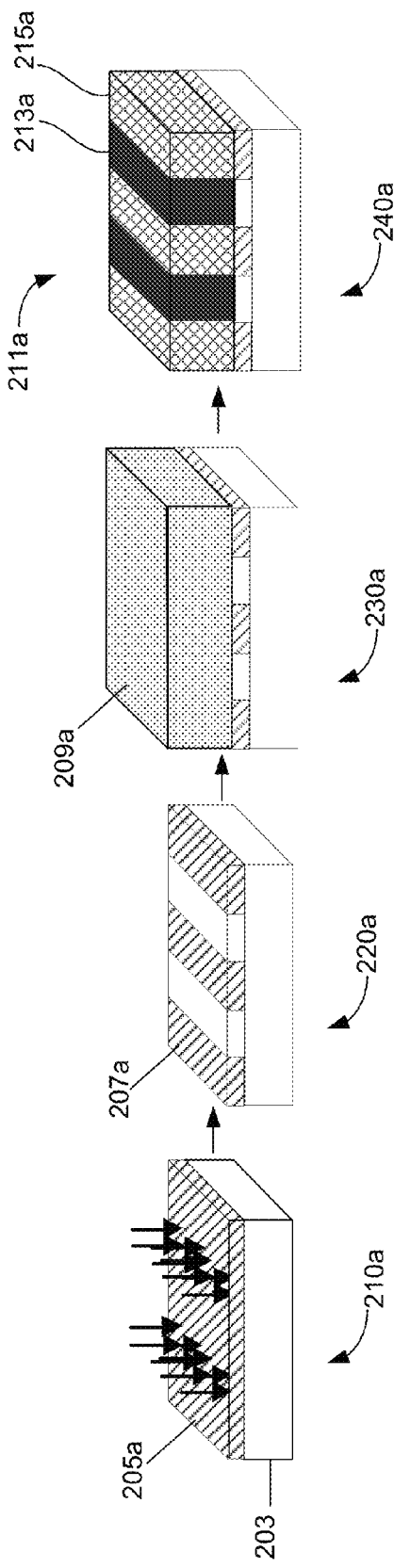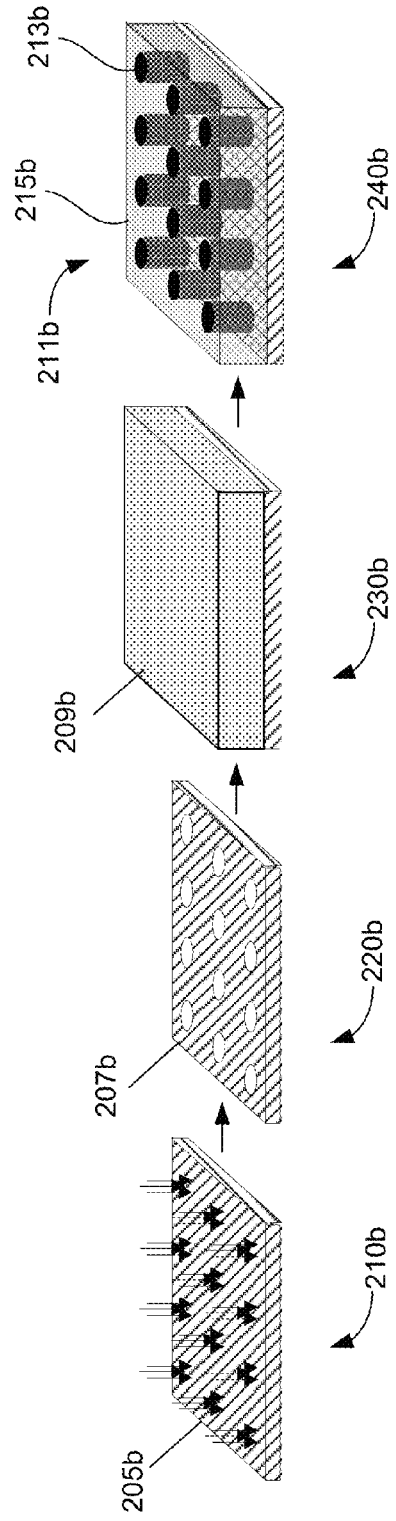

PATTERNING IN THE DIRECTED ASSEMBLY OF BLOCK COPOLYMERS USING TRIBLOCK OR MULTIBLOCK COPOLYMERS

CROSS-REFERENCE TO RELATED APPLICATION

This application claims benefit under 35 USC §119(e) to U.S. Provisional Patent Application No. 61/606,292, filed Mar. 2, 2012, which is incorporated by reference herein.

STATEMENT OF GOVERNMENT SUPPORT

This invention was made with government support under HR0011-04-3-0002 awarded by the Department of Defense/DARPA and 0425880 awarded by the National Science Foundation. The government has certain rights in the invention.

BACKGROUND OF THE INVENTION

Advanced nanoscale science and engineering have driven the fabrication of two-dimensional and three-dimensional structures with nanometer precision for various applications including electronics, photonics and biological engineering. Traditional patterning methods such as photolithography and electron beam lithography that have emerged from the microelectronics industry are limited in the features that can be formed as critical dimensions decrease and/or in fabrication of three-dimensional structures.

SUMMARY

Provided herein are block copolymer thin film structures and methods of fabrication. The methods involve directing the assembly of ABA triblock copolymers such that desired features are formed by domains of the assembled ABA triblock copolymer. In some embodiments, an ABA triblock copolymer is directed to assemble by a chemical pattern. Chemical patterns with periods much different than the natural period of the ABA triblock copolymer may be used to direct assembly of the ABA triblock copolymer. Applications include nanolithography for integrated circuits and other semiconductor devices, patterned media for applications such as data storage, fabrication of cell-based assays, nanoprinting, photovoltaic cells, and surface conduction electron-emitter displays.

One aspect of the disclosure relates to a method including depositing a layer of material comprising an ABA triblock copolymer on a pattern; and inducing microphase separation of the ABA triblock copolymer to thereby replicate the pattern in the layer. Another aspect of disclosure relates to a structure including a thin film overlying a pattern, with the thin film including microphase-separated domains of an ABA triblock copolymer. The pattern can be replicated in the thin film. In some embodiments of the methods or structures described herein, the ABA triblock copolymer has a bulk period $L_o$ and the pattern has a period $L_s$ that is greater than or equal to about 1.2 $L_o$. The pattern can have one or more features having effective pattern periods of at least ±1.2 $L_s$. In some embodiments, the ratio of A and B domain widths in the layer or film is between about 1.5 and 2.

Another aspect of the disclosure relates to a structure including a thin film overlying a pattern having a pattern period $L_s$, with the thin film including microphase-separated domains of a block copolymer that has a bulk period $L_o$, the pattern being replicated in the thin film, with $L_s$ at least about 1.2 $L_o$.

BRIEF DESCRIPTION OF THE DRAWINGS

FIGS. 2A and 2B show examples of directed assembly of lamellar and cylindrical ordered domains.

DETAILED DESCRIPTION

Introduction

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Provided herein are block copolymer thin film structures and methods of fabrication. The methods can involve directing the assembly of ABA triblock copolymers such that desired features are formed by domains of the assembled ABA triblock copolymer. In some embodiments, an ABA triblock copolymer is directed to assemble by a chemical pattern. Chemical patterns with periods much different than the natural period of the ABA triblock copolymer may be used to direct assembly of the ABA triblock copolymer. Applications include nanolithography for integrated circuits and other semiconductor devices, bit patterned media, fabrication of cell-based assays, nanoprinting, photovoltaic cells, and surface conduction electron-emitter displays.

In some embodiments, ABA triblock copolymers can be used to replicate patterns having a wide range of effective pattern periods and/or patterns having a period that deviate significantly from that of the bulk period of the block copolymer. This can be advantageous to fabricate asymmetric features such as bends. In some embodiments, ABA triblock copolymers can be used to replicate patterns having a wide range of effective pattern periods without being blended with a homopolymer or swellable material. This can be advantageous as homopolymer or swellable materials may degrade uniformity of features, pattern perfection and other pattern qualities. In some embodiments, a thin film having an asymmetric domain width can be formed varying the duty cycle of the underlying pattern. This can be useful in fabricating chemical patterns with well-controlled duty cycles, for example, by molecular transfer printing.

Figure 1:
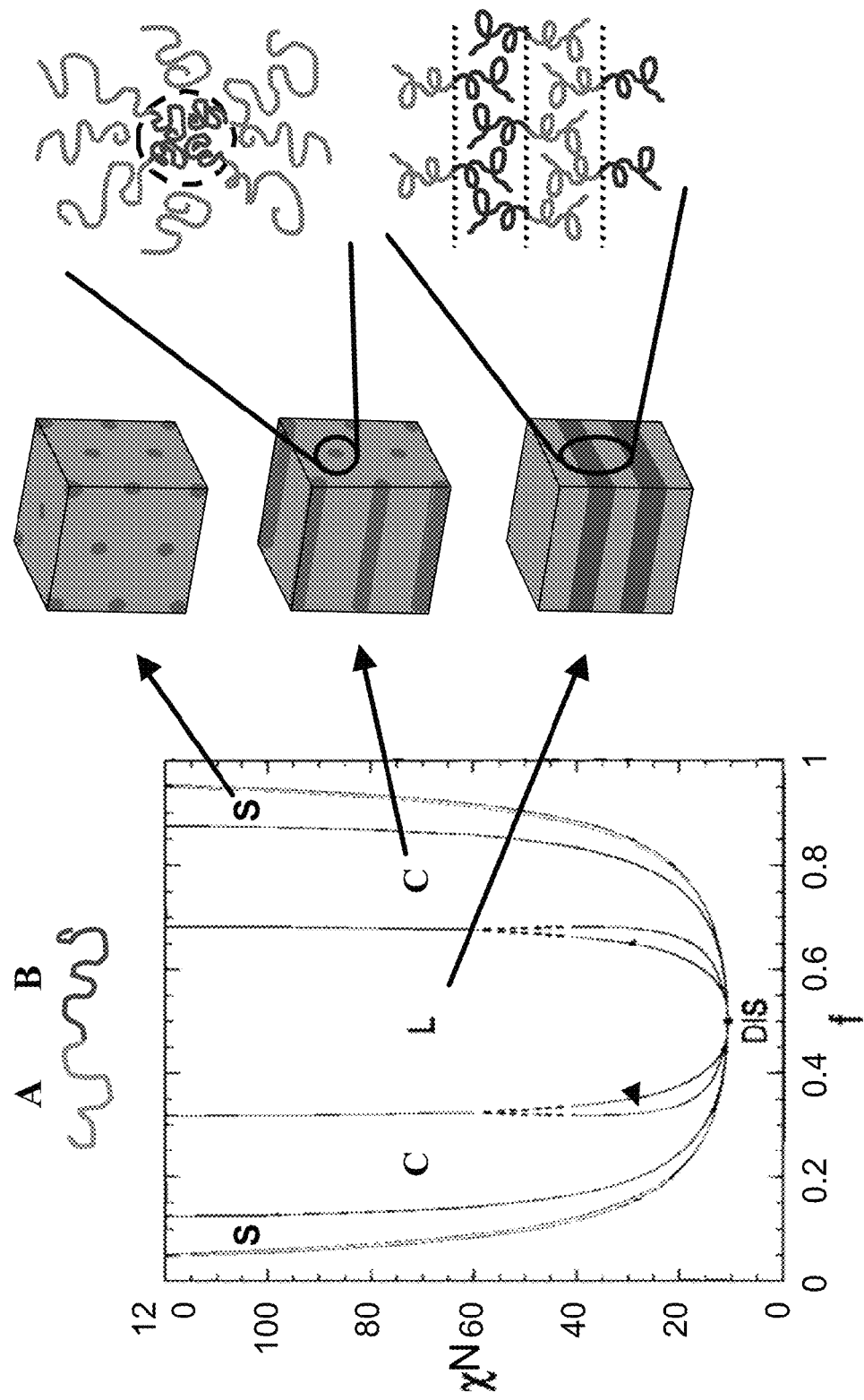
FIG. 1 shows ideal phase behavior of diblock copolymers.

Self-assembling materials spontaneously form structures at length scales of interest in nanotechnology. In the particular case of block copolymers, the thermodynamic driving forces for self-assembly are small and low-energy defects can get easily trapped. Block copolymers are a class of polymers that have two or more polymeric blocks. The structure of diblock copolymer AB, also denoted A-b-B, may correspond, for example, to AAAAAAA-BBBBBBBB. FIG. 1 shows theoretical phase behavior of diblock copolymers. The graph in FIG. 1 shows, $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 2 nm or 3 nm to 50 nm. The phase behavior of block copolymers containing more than two types of blocks (e.g., A-b-B-b-C), also results in microphase separation into different domains. The size and shape of the domains in the bulk depend on the overall degree of polymerization N, the repeat unit length a, the volume fraction f of one of the components f, and, to a lesser extent, the Flory-Huggins interaction parameter, $\chi$.

A block copolymer material may be characterized by bulk lattice constant or period $L_o$. For example, a lamellar block copolymer film has a bulk lamellar period or repeat unit, $L_o$ equal to the width of two stripes. For cylindrical and spherical domain structures, the periodicity of the bulk domain structures can be characterized by a center-to-center distance between the cylinders or spheres, e.g., in a hexagonal array.

While the FIG. 1 shows an example of phase behavior of a diblock copolymer for illustrative purposes, the phase behavior of triblock and higher order block copolymers also can results in microphase separation into different architectures. Methods described herein include directed assembly of A-b-B-b-A triblock copolymers (also referred to as ABA triblock copolymers) on patterned surfaces. In certain embodiments, the thin film block copolymer structures fabricated by the methods described have a high degree of fidelity and registration to the underlying pattern and exhibit unique assembly properties not observed with AB diblock copolymers, ABC terpolymers, or other block copolymer systems.

FIGS. 2A and 2B show examples of directed assembly of lamellar (FIG. 2A) and cylindrical (FIG. 2B) ordered domains. Patterning of layers 205a and 205b is indicated at 210a and 210b, respectively, with the arrows representing radiation appropriate to pattern a layer, such as x-ray radiation, extreme ultraviolet (EUV) radiation or electron beam radiation. Layers 205a and 205b, which can be referred to as patternable layers or imaging layers, are layers of material that can be selectively altered to create a chemical pattern. In one example, a layer of polystyrene (PS) brushes anchored to a surface is used as an imaging layer. FIG. 2A shows layer 205a on a substrate 203, which can be a silicon (Si) wafer or other appropriate substrate. Patterning can include use of a resist as generally known to one having ordinary skill in the art to expose regions of the patternable layer to form the desired pattern, followed by chemical modification of the exposed regions; for example, exposed regions of a PS brush layer can be oxidized. Chemically patterned surfaces 207a and 207b are indicated at 220a and 220b, respectively, with surface 207a patterned with alternating stripes and surface 207b patterned with an array of spots. Block copolymer material 209a and 209b is deposited on the chemically patterned surfaces 207a and 207b, respectively, as indicated at 230a and 230b. The block copolymer material 209a and 209b is then thermally annealed or otherwise induced to undergo microphase separation. The chemical difference of the patterned regions provides a driving force to register block copolymer microdomains with the chemical patterns. With appropriate choice of pattern and block copolymer material, the chemically patterned surfaces 207a and 207b can direct the assembly of the block copolymer material 209a and 209b such that the phase-separated domains are oriented perpendicular to the underlying surface and registered with the chemical pattern. The assembled phase-separated thin films 211a and 211b are shown at 240a and 240b, respectively. Thin film 211a includes lamellae of first polymer 213a and second polymer 215a aligned with the stripes of the underlying chemical pattern. Thin film 211b includes cylinders of a first polymer 213b in a matrix of a second polymer 215b, with the cylinders and matrix aligned with the underlying chemical pattern.

Periodic patterns formed on substrates or in thin block copolymer films may also be characterized by characteristic lengths or spacings in a pattern. $L_s$ is used herein to denote the period, pitch, lattice constant, spacing or other characteristic length of a pattern such as surface pattern. For example, a lamellar period $L_s$ of a two-phase lamellar pattern may be the width of two stripes. In another example, a period $L_s$ of an array of spots may be the center-to-center distance of spots. A block copolymer material having a bulk period $L_o$ can be directed to assemble on a patterned surface having an $L_s$ commensurate with $L_o$.

Surface energy, as used herein, refers to energy at the surface between a condensed and non-condensed phase, such as a solid block copolymer thin film or block copolymer film in the melt and a gas or vacuum. Interfacial energy, as used herein, refers to energy at the surface between two condensed phases, such as a solid block copolymer thin film or block copolymer thin film in the melt and a liquid or solid.

As indicated above, certain embodiments include directed assembly of ABA triblock copolymers. ABA triblock copolymers have two end "A" blocks covalently bonded to a middle "B" block. In the strong segregation regime, ABA triblock copolymers exhibit the same set of morphologies as their analogous AB diblock copolymers. ABA triblock copolymers can be directed to assemble on chemical patterns with periods, $L_s$, much different than the natural period, $L_o$, of the triblock copolymer. The allowable deviation of $L_s$ from $L_o$ in an ABA triblock copolymer is significantly larger than that of the AB diblock copolymer counterpart in an analogous directed assembly system. This may be due to the finding that assembly kinetics of an ABA triblock copolymer are several orders of magnitude slower than its AB diblock counterpart.

Figure 3:
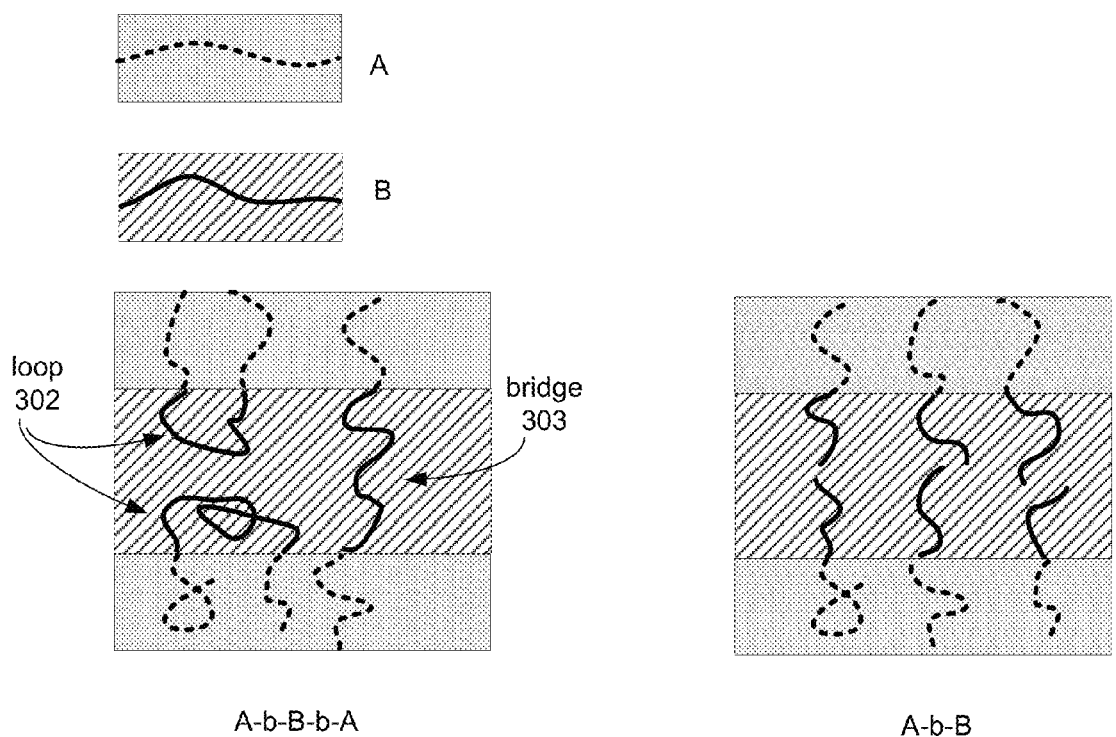
FIG. 3 shows a schematic illustration of loop and bridge structures of an ABA triblock copolymer.

Without being bound by a particular theory, it is believed that the difference in assembly kinetics may be attributable to the bridging and looping structures of middle blocks in assembled ABA triblock copolymer chains. FIG. 3 shows a schematic illustration of loop and bridge structures of an ABA triblock copolymer. The A-b-B-b-A triblock copolymer schematic includes loops 302 and bridge 303; looping and bridging configurations are not present in the counterpart A-b-B diblock copolymer. The B polymer of an ABA copolymer can span the B domain, forming a bridge 303, with the A ends in two different A domains, or both AB junction points of the ABA copolymer can be at the same A-B domain interface, with the A ends in the same A domain, forming a loop 302. The fraction of loop and bridge configurations in the bulk is about 50:50.

While the below description refers chiefly to ABA triblock copolymers, in certain embodiments, other multi-block copolymers that include loop and bridge configurations may be used instead of or in addition to ABA triblock copolymers.

According to various embodiments, ABA triblock copolymers can be "stretched" up to about 55%, i.e., an ABA triblock copolymer having a bulk period $L_o$ can be directed to assemble on a pattern having a length scale $L_s$ as high as about 1.55 $L_o$ or 1.6 $L_o$. Also according to various embodiments, ABA triblock copolymers can be "compressed" up to about 10%, i.e., an ABA triblock copolymer having a bulk period $L_o$ can be directed to assemble on a pattern having a length scale $L_s$ as low as about 0.9 $L_o$. For a particular $L_s$, ABA triblock copolymers having an $L_o$ such that 0.9 $L_o \leq L_s \leq 1.55 L_o$ (0.65 $L_s \leq L_o \leq 1.1 L_s$) can be directed to assemble by the underlying pattern and replicate the underlying pattern. In comparison, diblock AB copolymer directed assembly systems may tolerate a deviation of about ±10%, i.e., allowable $L_o$'s and $L_s$'s are given by 0.9 $L_o \leq L_s \leq 1.1 L_o$ (0.9 $L_s \leq L_o \leq 1.1 L_s$). Directed assembly systems having $L_o$'s outside the range 0.65 $L_s \leq L_o \leq 1.1 L_s$ may be obtainable for particular ABA triblock copolymers.

Figure 4:
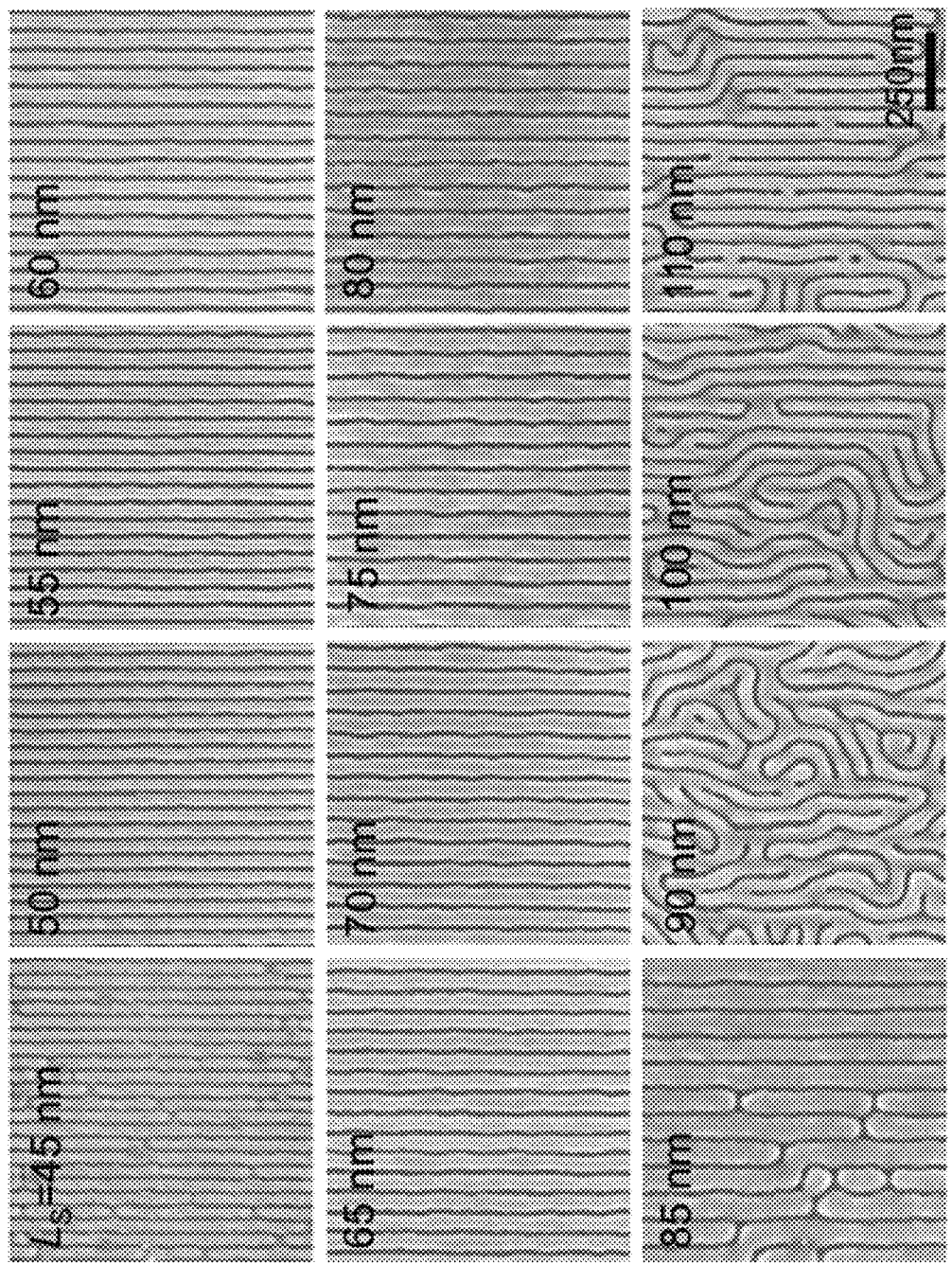
FIG. 4 shows top-down SEM images of a 50-nm-thick symmetric triblock copolymer (MSM-198) assembled on chemical patterns with varying pattern periods.

FIG. 4 shows top-down SEM images of a 50 nm thick symmetric triblock copolymer, poly(methyl methacrylate-b-styrene-b-methyl methacrylate) (MSM-198, $M_n$=52-94-52 kg·mol$^{-1}$, $L_o$ approximately 51.5 nm) on chemically patterned stripes with $L_s$ ranging from 45 nm to 110 nm. Defects, such as disconnected domains, are present in the assembled film on the pattern with $L_s$=45 nm, indicating that MSM-198 equilibrates with feature size about 13% smaller than $L_o$. This is similar to its diblock counterpart, PS-b-PMMA (SM-104, $M_n$=52-52 kg·mol$^{-1}$) on the same chemical patterns. Defect-free assembly of MSM-198 was obtained on patterns with $L_s$=50-80 nm, with domains registered on underlying patterns and oriented perpendicular to substrates. Defects, such as disconnections and dislocations of domains, are observed on patterns with $L_s$=85 nm. With the increase of $L_s$ to 90 nm, the copolymer domains no longer registered to the underlying chemical pattern, and fingerprint-like structures formed on film surfaces. Further increase of $L_s$ to 100 nm and 110 nm resulted in domains that are partially registered to the underlying patterned substrates, forming structures that combine fingerprint and interpolated line structures with periods of about 50-55 nm. At $L_s \gg L_o$, the underlying chemical pattern does not provide sufficient energy for polymer chains to extend and align to it, leading to the formation of fingerprint structures or interpolated line structures.

Figure 5:
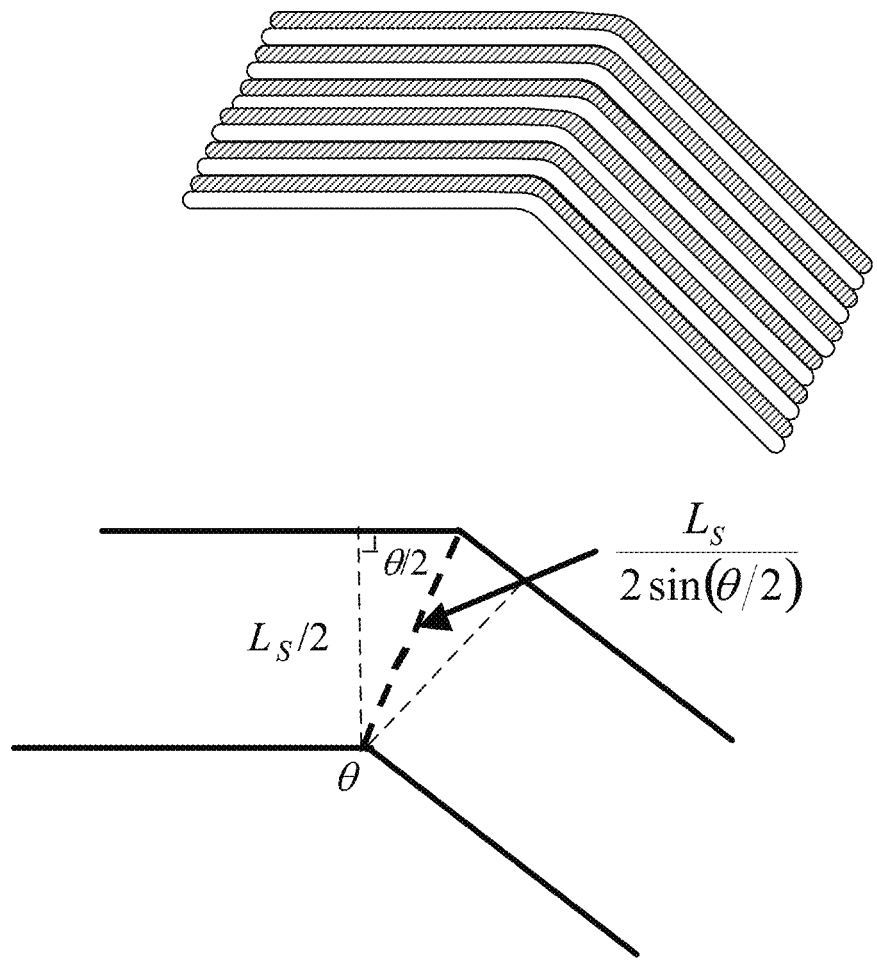
FIG. 5 is a schematic example of a pattern including a varying effective pattern period.
Figure 6A:
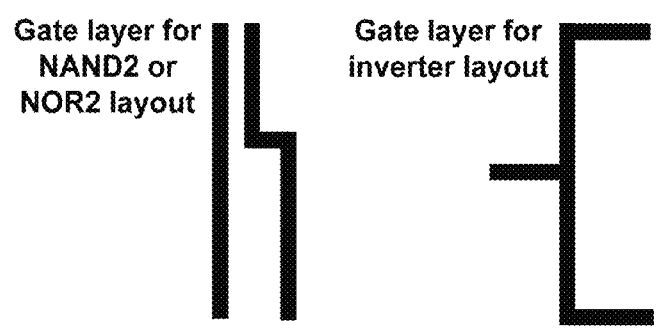
FIG. 6A shows examples of patterns that may be used integrated circuit and logic device fabrication.
Figure 6B:
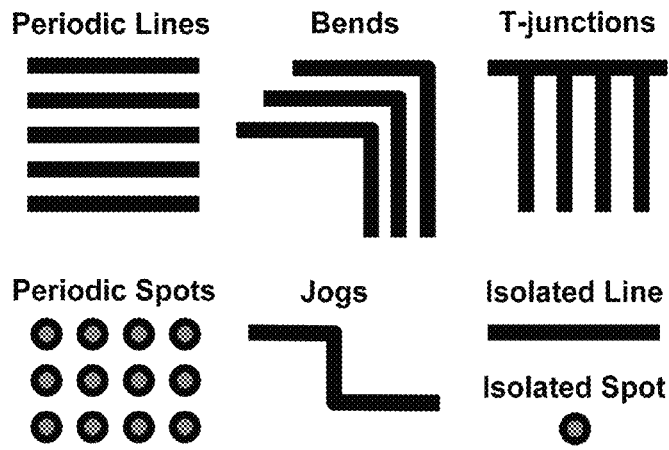
FIG. 6B shows examples of types of pattern features that may be used integrated circuit and logic device fabrication.

In some embodiments, complex thin film structures including ABA triblock copolymers and/or fabricated using directed assembly of ABA triblock copolymers are provided. These include structures having irregular features such as bends, jogs and T-junctions, as well any other irregular features in which the effective pattern period is non-constant. An example is depicted in FIG. 5, which shows the distance between interfaces of an irregular feature (a bend) in a pattern. With $L_s$ equal to the width of two stripes, assuming a symmetric pattern where the shaded and unshaded stripes are of equal width, the distance between interfaces is ½ $L_s$ along the unbent linear portions of the pattern. At the bend corner, however, the distance between interfaces is $L_s/2 \sin(\theta/2)$—comparable to having a period of $L_s/\sin(\theta/2)$. Thus the effective period at the bend corner $L_c$ is $L_s/\sin(\theta/2)$. The bent nonlinear portions of the pattern in FIG. 5 have different periods than the linear portions. FIG. 6B depicts other features that may be included in a pattern in certain embodiments, including bend, t-junction and jog features that have non-constant effective pattern periods. Patterns of spots and parallel or non-parallel lines may also have varying spacing and periods across a pattern. In some embodiments, such patterns can be used for pattern transfer and integrated circuit fabrication. For example, FIG. 6A shows generalized layouts for gate layers for a NAND2 or NOR2 layout and an inverter layout. The NAND2 or NOR2 gate layer includes a jog and the inverter gate layer includes both a t-junction and sharp 90° angles. In addition to lamellae-forming ABA triblock copolymers, in some embodiments, cylinder-forming or sphere-forming ABA triblock copolymers can be directed to assemble on spot chemical patterns with $L_s$ much larger than $L_o$, which may find applications in bit patterned storage media. Many integrated circuit layouts can be fabricated using the features shown in FIG. 6B. Spots, for example, can be used to for pattern transfer or fabrication of contacts or contact holes. These features may be patterned either as dense arrays or as isolated structures, for example with sub-32 nm, sub-22 nm or smaller critical dimensions.

Figure 7:
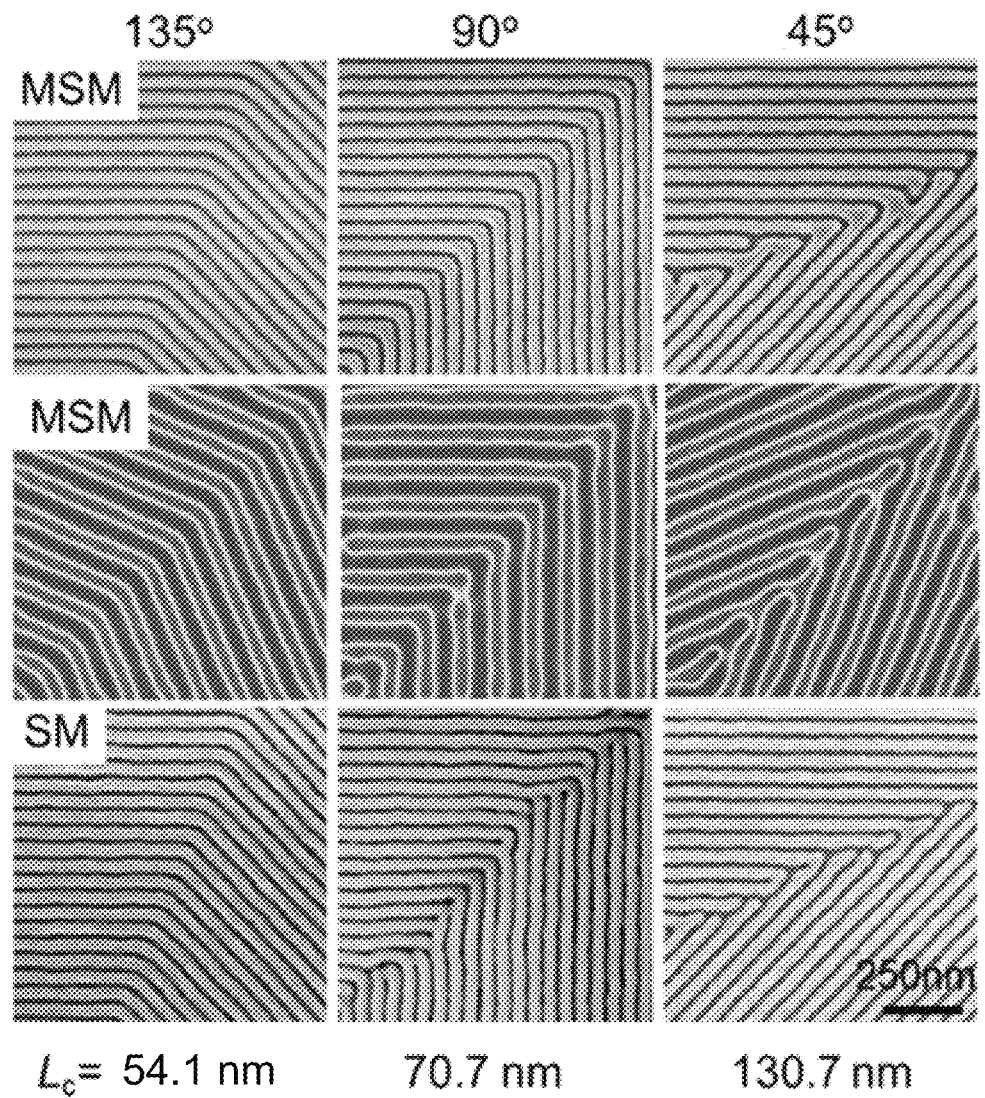
FIG. 7 shows top-down SEM images (top row) and simulation results (middle row) of an ABA triblock copolymer (MSM-198) and top-down SEM images (bottom row) of an AB diblock copolymer (SM-104) assembled on chemical patterns including bends of various angles.

For diblock copolymers, block copolymer/homopolymer blends can be used to achieve defect-free structures for bends, jogs and T-junctions, as described, for example in US-2006-0134556-A1, titled "Methods And Compositions For Forming Aperiodic Patterned Copolymer Films," incorporated by reference herein. The large expansion ratio of ABA triblock copolymers on chemical patterns can be leveraged to fabricate complex structures having a range of effective pattern periods. In some embodiments, the ABA triblock copolymer may be used to fabricate these structures without need for an addition of a homopolymer or other swellable material. FIG. 7 shows SEM images of MSM-198 (top row) and SM-104 (bottom row) assembled on chemical patterns with $L_s$ of 50 nm having bends of 45°, 90°, and 135°, along with simulation results of MSM-198 on the chemical patterns (middle row).

For $L_s$=50 nm the effective periods at the bend corners ($L_e$) are 54.1, 70.7, and 130.7 nm for 135°, 90°, and 45° bends, respectively. The experimental and simulation results show defect-free assembly of MSM-198 domains at corners of the 135° and 90° bends, while disconnected or mismatched domains formed at the corners of patterns with 45° angles. For the assembly of SM-104, dislocations of domains were observed at corners on 90° and 45° bends. The effective periods at the corners are significantly larger than their natural periods such that the polymer chains undergo considerable expansion to achieve defect-free assembly. Without being bound by a particular theory, it is believed that the difference in the assembly behaviors between MSM-198 and SM-104 on 90° bends and on patterns with $L_s \neq L_o$ is a result of the surprisingly large expansion ratio of MSM-198 on chemical patterns. Defect-free assembly on chemical patterns including 45° bends, and other chemical patterns having a wide range of effective pattern periods, can be achieved by an appropriate choice of ABA triblock copolymers.

In some embodiments, the duty cycle of the underlying chemical patterns are varied to tune the ratio of domain widths in the assembled block copolymer film. Duty cycle refers to the relative widths of the patterned features. For a pattern of alternating stripes, for example, a pattern having alternating stripes of equal width has 50:50 duty cycle, a pattern having stripes of width W alternating with stripes of width 3 W has a duty cycle of 25:75 or 75:25, etc. In some embodiments, density multiplication can be achieved by varying the duty cycle. Density multiplication refers the density of features in an assembled film being greater than that of the chemically patterned substrate. In some embodiments, 2× density multiplication can be achieved on patterns having duty cycles of 30:70 or 70:30.

In some embodiments, domain sizes of an assembled ABA triblock copolymer may be tuned by varying the duty cycle of the chemical patterns. This is in contrast to some systems in which the domain widths can remain substantially constant as the pattern duty cycle is varied due to self-healing properties. For example, directed assembly of PS-b-PMMA diblock copolymers on chemical patterns, can result in domain widths of PS and PMMA nearly equal at the film surfaces due to the self-healing property of copolymers even when the pattern duty cycles on substrates were different. In comparison, for MSM-198 on $L_s$=70 nm pattern, the resulting PS domain width was about 44 nm, with the ratio of PS to PMMA domain width about 1.8:1. AFM measurements showed the surface was almost flat with no significant topographic difference between PS and PMMA regions. The asymmetric domain width on surfaces is very useful to fabricate chemical patterns with well-controlled duty cycles, for example, by molecular transfer printing.

Figure 9:
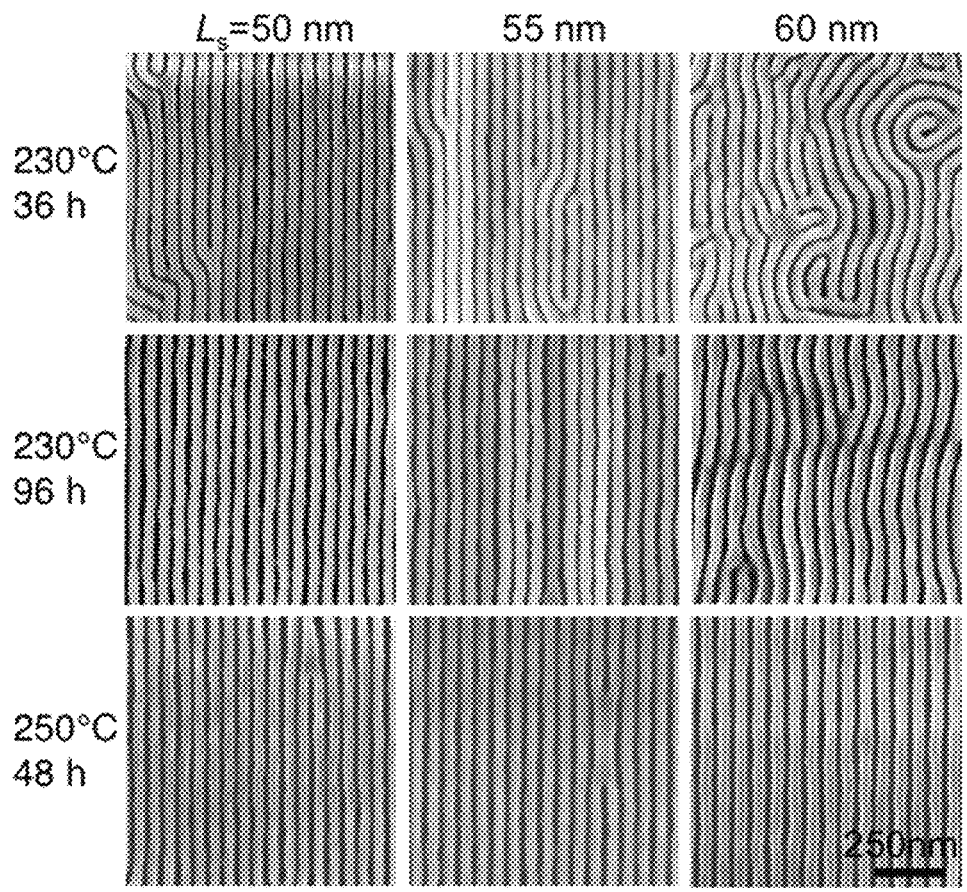
FIG. 9 shows top-down SEM images of assembled MSM-198 thin films on chemical patterns having various pattern periods for various anneal times.

The film thickness at which copolymers can be directed to assemble depends on the strength of chemical patterns and the free energy per volume. In some embodiments, the ABA triblock copolymers can be assembled on chemical patterns greater than about 0.5 $L_o$, greater than or equal to about $L_o$, or greater than equal to about 1.5 $L_o$. For example, the assembly of a 74-nm-thick (about 1.44 $L_o$) film of MSM-198 on chemical patterns with $L_s$=50 nm, 55 nm, and 60 nm is shown in FIG. 9. Directed assembly on patterns with $L_s$=50 nm and 55 nm was achieved after the sample had been annealed at 230° C. for 36 hours, but with dislocated domains as defects. On $L_s$=60 nm pattern, guided assembly was obtained and the copolymer domains were partially aligned along the pattern direction. When annealing time was increased to 96 hours, the defects disappeared on patterns with $L_s$=50 and 55 nm, and wavy lines were found on $L_s$=60 nm patterns. When the film was annealed at 250° C., perfect assembly of MSM-198 on $L_s$=60 nm was achieved within 48 hours. Further increase of the annealing time or temperature may lead to the directed assembly of even thicker films, however, the thermal degradation of the block copolymers may be a concern, especially under high annealing temperature.

Figure 8:
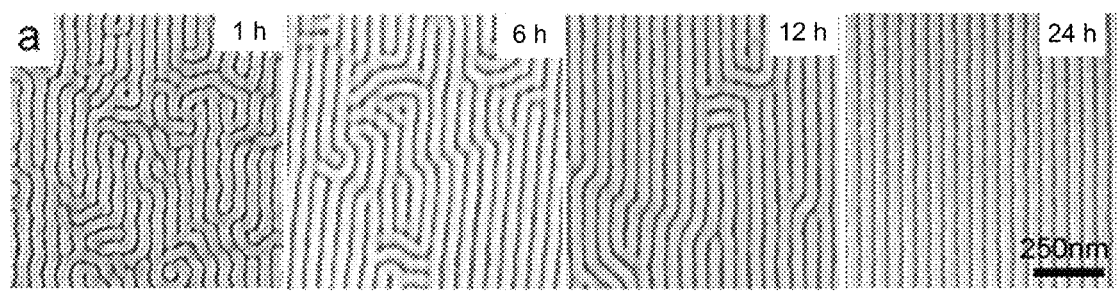
FIG. 8 shows top-down SEM images of assembled MSM-198 thin films on chemical patterns for various anneal times.

As indicated above, the assembly kinetics of ABA triblock copolymers were found to be several orders of slower than an AB diblock counterpart. FIG. 8 shows SEM images of 50 nm thick films of MSM-198 that were directed to assemble on chemical patterns with $L_s$=50 nm at 230° C. for various anneal times. After one hour annealing, the copolymer domains oriented perpendicular to the substrate, and were partially registered on the chemical patterns with fingerprint-like defect structures or dislocations. The defect density gradually decreased with the increase of the annealing time from 1 to 6 to 12 hours. Further increase of the annealing time to 24 hours, defect-free assembly of MSM-198 was achieved on the entire patterned area. In comparison, defect-free assembly of SM-104 on chemical patterns has been achieved within one minute at 230° C. The assembly kinetics may correlate to the chain mobility that is associated with the molecular weight and chain entanglement. MSM-198 has a higher molecular weight than SM-104, however, the molecular weight difference should not contribute to such a large difference in the assembly kinetics because directed assembly of a diblock PS-b-PMMA with $M_n$=85-91 kg/mol, close to $M_n$ of MSM-198, was achieved on chemical patterns with $L_s$=85 nm at 230° C. within only 5 min. MSM-198 and SM-104 differ structurally in that the middle blocks of MSM-198 can bridge between two interfaces, as schematically illustrated in FIG. 3. Without being bound by a particular theory, it is believed that the presence of a significant portion of bridging or looping configurations and the entanglement of the middle blocks may be a main reason for the slower kinetics for MSM-198 and ABA triblocks in general.

Figure 10A:
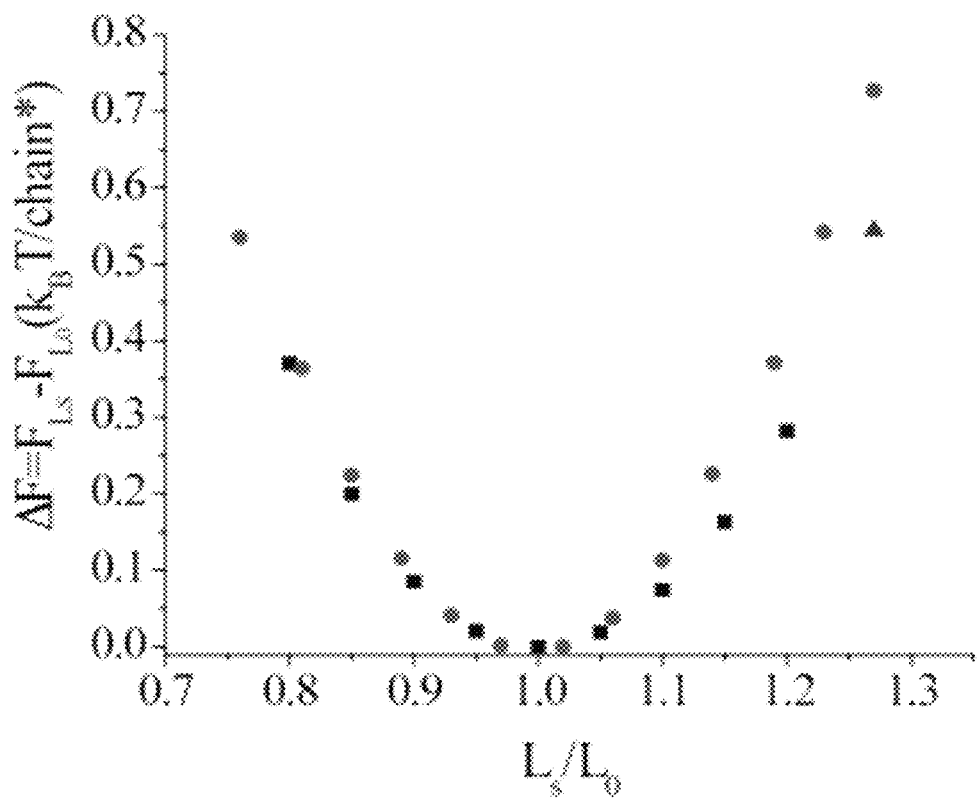
FIG. 10A shows the free energy per chain calculated using thermodynamic integration for a triblock system as compared to a comparable diblock system on chemical patterns with various $L_s$.

The experimentally observed assembly behaviors of MSM-198 on chemical patterns with different $L_s$ is in contradiction to the symmetry of a free energy plot calculated using thermodynamic integration, suggesting that kinetic rather than thermodynamic effects are behind the formation of ABA triblock films at formation of structures at $L_s \neq L_o$. FIG. 10A is a plot showing the free energy per chain calculated using thermodynamic integration for a triblock system as compared to a comparable diblock system on chemical patterns with various $L_s$. The free energy difference (in ln kBT/chain) for the triblock system (circles) and diblock system (squares) is plotted in FIG. 8. The circles show the free energy difference (in $k_B$T/chain) between perfectly registered vertical lamellae structures on various pattern periods and perfectly registered lamellae at $L_s$=1.0 $L_o$. The triangle corresponds to $L_s$=1.3 $L_o$ that exhibits unregistered lamellae structures. The squares show the free energy difference for a PS-b-PMMA diblock rescaled to match the molecular weight of MSM-198. The free energy plot of the triblock copolymer is symmetric and similar to that of the diblock copolymer system. This suggests that there are no thermodynamic driving forces that would cause a broader or asymmetric range of $L_s$ exhibiting expanded lamellar structures in the triblock versus that observed in the diblock. For directed assembly, the chemical difference between patterned regions (e.g., patterned stripes) provides a driving force to direct the assembly of block copolymer domains. The driving force should be the same at different pattern periods; however, the experimentally observed assembly behavior of MSM-198 on chemical patterns with different $L_s$ is in contradiction to the symmetry of the free energy plot. Without being bound by a particular theory, it is believed that observed lamellar morphologies at large $L_s$ correspond to kinetically trapped, metastable states. Additional free energy calculations showed that a system quenched from a fingerprint structure on a striped-patterned substrate obtained from a Monte Carlo simulation have lower free energy than morphologies observed when the system is quenched from a disordered state on a striped-patterned substrate when $L_s > 1.2 \, L_o$. This also suggests that registered lamellar morphologies observed for $L_s > 1.2 \, L_o$ (in both experiments and simulations) represent kinetically trapped, non-equilibrium states.

Parameters

The following are examples of substrates, patterning techniques, patterns, and block copolymer materials that may be used in accordance with certain embodiments.

Substrate

Any type of substrate may be used. In semiconductor applications, wherein the block copolymer film is to be used as a resist mask for further processing, substrates such as silicon or gallium arsenide may be used. For patterned media applications, a master pattern for patterned media may be made on almost any substrate material, e.g., silicon, quartz, or glass.

According to various embodiments, the substrate may be provided with a thin film or imaging layer thereon. The imaging layer may be made of any type of material that can be patterned or selectively activated. In a certain embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane.

In certain embodiments, the imaging layer or thin film to be patterned is a polymer brush layer. In certain embodiments, the polymer brush may include one or more homopolymers or copolymers of the monomers that make up the block copolymer material. For example, a polymer brush of at least one of styrene and methyl methylacrylate may be used where the block copolymer material is PS-b-PMMA. One example of a polymer brush to be used in a thin film is PSOH.

In some embodiments, a pattern may be provided without an underlying substrate, for example as an unsupported polymer film.

Patterning

Patterns may be formed by any method, including all chemical, topographical, optical, electrical, mechanical patterning and all other methods of selectively activating a substrate. A chemically patterned surface can include, for example, patterned polymer brushes or mats, including copolymers, mixtures of different copolymers, homopolymers, mixtures of different homopolmyers, block oligomers, and mixtures of different block oligomers. In embodiments where a substrate is provided with an imaging layer (such as a self-assembled monolayer or polymer brush layer) patterning the substrate may include patterning the imaging layer. Alternatively, a substrate may be patterned by selectively applying the pattern material to the substrate. In some embodiments, a resist can be patterned using an appropriate method. The substrate patterning may include top-down patterning (e.g. lithography), bottom-up assembly (e.g. block copolymer self-assembly), or a combination of top-down and bottom-up techniques. In certain embodiments, the substrate is patterned with x-ray lithography, extreme ultraviolet (EUV) lithography or electron beam lithography. In certain embodiments, a chemically patterned surface can be prepared using a molecular transfer printing method as disclosed in US 2009-0260750, titled "Molecular Transfer Printing Using Block Copolymers," incorporated by reference herein.

Pattern

Substrate surface patterns, or other patterns that direct the assembly of block copolymer (as well as the block copolymer material used) affect self-assembled domains that result from the processes described above. The surface pattern and the ABA triblock copolymer film deposited on it can be chosen to achieve the desired pattern in the block copolymer film. In certain embodiments, there is a 1:1 correspondence between the number of features patterned on the substrate (by e-beam lithography or other technique) and the number of features in the self-assembled block copolymer film. In other embodiments, there may be a 1:2, 1:4 or other correspondence, with the density of the substrate pattern multiplied as described in US 2009-0196488, titled "Density Multiplication And Improved Lithography By Directed Block Copolymer Assembly" incorporated by reference herein. It should be noted that in certain cases, the 1:1 correspondence (or 1:2, etc.) might not be exactly 1:1 but about 1:1, e.g., due to imperfections in the substrate pattern.

The directed assembly may or may not be epitaxial according to various embodiments. That is, in certain embodiments, the features as defined by the block copolymer domains in the block copolymer film are located directly above the features in the chemical contrast pattern on the substrate. In other embodiments, however, the growth of the block copolymer film is not epitaxial. In these cases, the chemical contrast (or other substrate pattern) may be offset from the self-assembled domains. The block copolymer domains are typically spatially registered with the underlying chemical pattern, such that the location of a block copolymer domain in relation to a location of a patterned feature is precisely determined. In some embodiments, registered block copolymer domains are aligned such that an interface between domains overlies an interface between the adjacent pattern features. In some other embodiments, registered domains may be offset from and/or differently sized than the underlying pattern features.

In certain embodiments, the pattern corresponds to the geometry of the bulk copolymer material. For example, hexagonal arrays of cylinders are observed bulk morphologies of certain block copolymers. However, in other embodiments, the substrate pattern and the bulk copolymer material do not share the same geometry. For example, a block copolymer film having domains of square arrays of cylinders may be assembled using a material that displays hexagonal arrays of cylinders in the bulk.

The individual features patterned on the substrate may be smaller than or larger than the mean feature size of the block copolymer domains (or the desired feature size). In certain embodiments, the pattern has at least one dimension within an order of magnitude of a dimension of one domain in the block copolymer material.

In certain embodiments, the pattern period $L_s$ deviates from the bulk period $L_o$ of the ABA triblock copolymer to be deposited on it. For example, in some embodiments, $L_s$ and $L_o$ can differ by as much as about 60%, with the pattern still effective to drive the assembly of the ABA triblock copolymer. In some embodiments, $0.9 \, L_o \leq L_s \leq 1.55 \, L_o$. Greater deviations of $L_s$ and $L_o$ may be tolerated for particular ABA triblock copolymers and pattern systems.

In some embodiments, a pattern may include a varying effective pattern period. In some embodiments, a pattern may be characterized as having a pattern period $L_s$ that represents that length scale of uniformly spaced features that may dominate or be a major part of a pattern. For example, the pattern period $L_s$ in the example depicted in FIG. 5 is the width of straight portions of adjacent stripes. Irregular features such as bends and t-junctions may give rise to effective pattern periods that differ from the pattern period $L_s$. In some embodiments, a pattern may not have any one length scale that dominates the pattern, but have a collection of features and associated effective pattern periods. In some embodiments, the effective pattern period $L_{s-eff}$ may vary by up to about 30%, 40% or 50% or greater across the pattern.

Further examples of patterns are described in US-2006-0134556, referenced above, and in US-2008-0299353, titled "Methods And Compositions For Forming Patterns With Isolated Or Discrete Features Using Block Copolymer Materials," both of which are incorporated by reference herein.

Block Copolymer Material

In certain embodiments, the block copolymer materials include ABA triblock copolymers. ABA triblock copolymers have two end A blocks covalently bonded to a middle B block. The end A blocks can be of the same or different size. In some embodiments, the length of the B block may be varied to vary the ratio of bridge and loop structures.

Any type of copolymer that undergoes microphase separation under appropriate thermodynamic conditions may be used. This includes block copolymers that have as components glassy polymers such as PS and PMMA, which have relatively high glass transition temperatures, as well as more block copolymers that have more elastomeric polymers as components. Classes of polymers that can be used as A or B components of ABA triblocks include silicon-containing polymers, metal-containing polymers, and polymers designed to have or low etch selectivities. Other examples of components of ABA triblock copolymers include polyethylene oxide (PEO), polydimethylsiloxane (PDMS), poly-2-vinylpyridine (P2PV), poly-4-vinylpyridine (P4PV), polylactic acid (PLA), polyglycolic acid (PGA), polystyrene-polyferrocenyldimethylsilane. For example, a PS-b-P2PV-PS triblock copolymer may be used.

Block copolymer materials having various bulk morphologies may be used, including lamellae-forming block copolymers, cylinder-forming block copolymers, and sphere-forming block copolymers. Asymmetric and symmetric ABA block copolymers can be used. For example, a PMMA-b-PS-PMMA having about 30 vol. % PMMA and 70 vol. % PS can be used. According to various embodiments, the volume fraction of the B block can range from about 5% to 95% or 10% to 90%.

Without being bound by a particular theory, it is believed that the abilitymolecules to assemble with different loop and bridge structures in the B block of an ABA triblock copolymer can allow it to form a variety of desired structures.

The block copolymer material may include one or more additional block copolymers. In some embodiments, the material may be a block copolymer/block copolymer blend, with at least one of the block copolymers in the blend being an ABA triblock copolymer.

The block copolymer material may also include one or more homopolymers. In some embodiments, the material may be an ABA triblock copolymer/homopolymer blend or an ABA triblock copolymer/homopolymer/homopolymer blend, such as a PS-b-PMMA-b-PS/PS/PMMA blend.

The block copolymer material may include any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

As described above, in some embodiments, the large expansion ratio of ABA triblock copolymers on chemical patterns can be leveraged to fabricate complex structures having a range of effective pattern periods. As such, in some embodiments, the block copolymer material includes an ABA triblock copolymer without homopolymers and/or without swellable materials. In some other embodiments, the block copolymer material may include a homopolymer or swellable material, for example, to increase an expansion ratio.

The block copolymer material can be deposited on a chemical pattern by any appropriate method, including but not limited to, spin coating, dip coating and solvent casting. Microphase separation can be induced by thermal annealing. In some embodiments, solvent annealing may be employed. Techniques for solvent annealing block copolymers on patterns are described in U.S. Provisional Patent Application No. 61/440,354, titled "Solvent Annealing Block Copolymers On Patterned Substrates," incorporated by reference herein.

EXPERIMENTS AND SIMULATIONS

Example 1

Directed Assembly of MSM-198

Materials

Poly(methyl methacrylate-b-styrene-b-methyl methacrylate) (MSM-198, Mn=52-94-52 kg·mol-1, polydispersity index (PDI)=1.22), PS-b-PMMA (SM-104, Mn=52-52 kg·mol-1, PDI=1.07), and PS-OH (Mn=6 kg·mol-1, PDI=1.05) were purchased from Polymer Source, Inc. PMMA photoresist (Mn=950 kg·mol-1, 4 wt % in chlorobenzene) was purchased from MicroChem, Inc. All solvents were purchased from Aldrich and used as received.

The as-received MSM-198 had a low molecular weight shoulder in the gel permeation chromatography (GPC) trace, indicating the presence of either homopolymer or copolymer impurities. To minimize the effect of impurities on the assembly behavior, MSM-198 was fractionated prior to use. MSM-198 (0.5 g) was first dissolved in THF (5 mL), and methanol (~10 mL) was then added drop-wise to the solution while stirring. The solution was kept at 4° C. overnight. The upper layer solution was decanted to remove the lower-molecular-weight soluble fraction. This purification step was repeated for three times to give 0.2 g of purified MSM-198. After three fractionation steps, GPC analysis of the purified MSM-198 showed that the low molecular weight shoulder in the starting MSM-198 was removed and the PDI was reduced from 1.22 to 1.09 (relative to a PS standard, using THF as an eluent). The molar ratio of S to MMA was 1:1.17 by comparing the peak areas of aromatic hydrogens in S and the methyl group in MMA in 1H NMR (Varian UNITY 500 NMR Spectrometer) spectra of the purified MSM-198 in CDCl3. $L_o$ of a bulk sample was measured to be 48.5 nm on a Ragaku small angle X-ray scattering (SAXS) system. The SAXS sample was annealed at 190° C. under vacuum for 60 min, and then cooled to room temperature before the data collection.

Assembly on Chemically Neutral Surfaces

Figure 11:
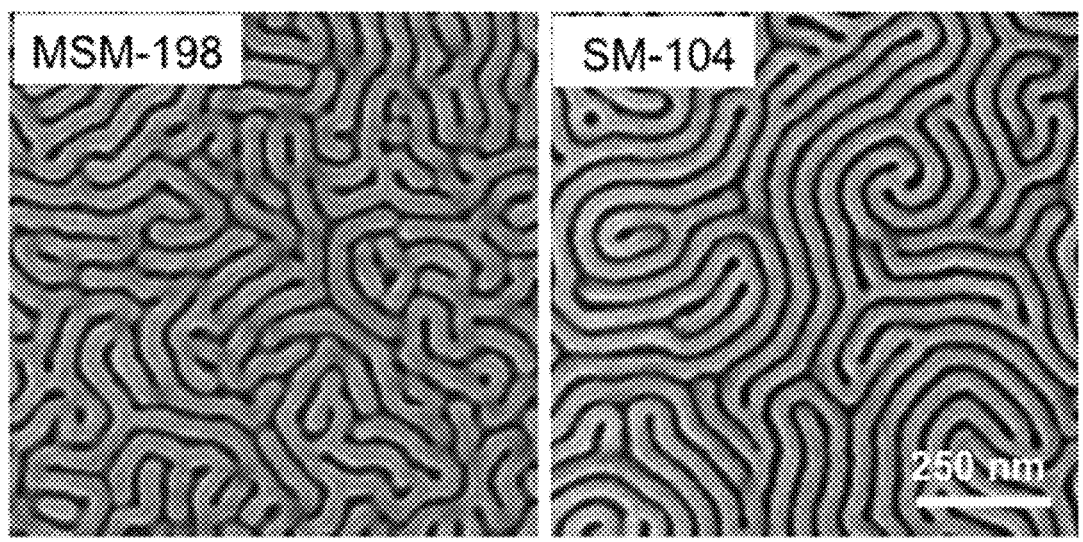
FIG. 11 shows top-down SEM images of films of assembled SM-104 and MSM-198 on neutral surfaces.

The assembly behavior of MSM-198 on homogeneous non-preferential (or chemically neutral) surfaces was studied before directing the assembly of MSM-198 on chemical patterns. The neutral surface was prepared by grafting hydroxyl-terminated poly(styrene-r-methyl methacrylate) with 60 mol % of styrene fraction on a silicon substrate. The film thickness was about 50 nm, which is close to the $L_o$ of MSM-198. The assembly was performed at 230° C. for 24 hrs. A control film of SM-104 was also processed and annealed under same conditions. FIG. 11 shows SEM images of films of assembled SM-104 and MSM-198 on the neutral surfaces. MSM-198 showed similar assembly behavior to SM-104 on neutral surfaces, with lamellar domains oriented perpendicular to the substrates in fingerprint-like. The period, $L_o$, of MSM-198 in thin films on neutral surfaces was measured to be 51.5 nm by Fourier transform analysis of SEM images, and was in good agreement with the period measured by SAXS. Close inspection of SEM images in FIG. 11 revealed that MSM-198 had an apparent shorter correlation length than SM-104. Analogous to the dependence of the correlation length of block copolymers on the number of blocks in thin films, a similar trend in the decrease of grain sizes with the increase of number of blocks in a block copolymer was also observed in lamellae-forming $(AB)_n$ multi-block copolymers in bulk.

Assembly on Chemically Patterned Surfaces

Chemical patterns were fabricated on end-grafted PS brushes by e-beam lithography as schematically illustrated in FIG. 2A and described as follows. A 40-nm-thick PS-OH (6 kg·mol-1) film was deposited on an oxygen-plasma-cleaned silicon substrate by spin-coating from 1 wt % toluene solution, and annealed at 160° C. for 24 hrs under vacuum. Excess PS-OH was removed by sonication in toluene to form a PS brush layer with a thickness of about 4.1 nm. A 50-nm-thick PMMA photoresist (950 kg·mol-1) film was deposited onto the PS brush from a 1.2 wt % chlorobenzene solution and baked at 160° C. for 60 seconds. Striped patterns with periods, LS, varying from 45 nm to 110 nm in 5 nm increments, and bends with $L_s$ of 50 nm and angles of 135°, 90° and 45° were exposed on the resists using electron beam lithography (EBL). EBL was performed on a LEO 1550 VP SEM equipped with a J. C. Nabity pattern generation system with an acceleration voltage of 20 kV. Exposed substrates were developed with a 1:3 (v:v) mixture of methyl isobutyl ketone: isopropanol for 60 seconds and rinsed with isopropanol. The resulting resist pattern was transformed into a chemical pattern on the PS brush by exposing the sample to an oxygen plasma followed by stripping the PMMA photoresist in warm chlorobenzene. Films of MSM-198 and SM-104 were deposited on the chemically patterned substrates by spin-coating from 1.5 wt % toluene solutions, annealed at 230° C. for various times under vacuum, and imaged by SEM with an acceleration voltage of 1 kV.

The assembly kinetics of MSM-198 on chemical patterns were found to be approximately three orders magnitude slower than that of SM-104. 50-nm-thick films of MSM-198 that were directed to assemble on chemical patterns with $L_s$=50 nm at 230° C. for various times. SEM images of the assembled films at various times are shown in FIG. 8, discussed above. It should be noted that the bright stripes are wider than dark stripes due to the imaging artifact.

Example 2

MC Simulations of ABA Triblock Copolymers on Chemical Patterns

Theoretically informed Monte Carlo (MC) simulations were used to investigate the structure evolution of ABA triblock copolymers on chemical patterns. The simulation box was $3 L_o \times 3 L_o \times 1 L_o$. At $\lambda_s N$=0.5, the structure evolution from simulations agreed well with experimental observation. The structures, which were observed at intermediate stages of the simulation, showed that the copolymer domains simultaneously nucleated at both interfaces, and that the substrate effect dominated the film structure in thin films. The domains registered on the chemical patterns near the substrate even within the first 500 MC steps, and propagated towards the film surface with the increase of simulation time. The surface structure evolved from random to well-aligned lines registered on the chemical patterns, in agreement with the structural evolution observed experimentally.

Example 3

Directed Assembly of ABA Triblock Copolymers on Chemical Patterns with $L_s \neq L_o$ Thin films of MSM-198 were directed to assemble on chemical patterns with $L_s \neq L_o$. FIG. 4, discussed above, shows the top-down SEM images of 50-nm-thick MSM-198 films assembled on chemical patterns with $L_s$=45-110 nm at 230° C. for 36 hrs. Defects, e.g. disconnected domains, were observed in the assembled film on the pattern with $L_s$=45 nm, indicating that MSM-198 could equilibrate with feature size about 13% smaller than $L_o$, similar to SM-104. Defect-free assembly of MSM-198 was obtained on patterns with $L_s$=50-80 nm, with domains registered on underlying patterns and oriented perpendicular to substrates. PMMA domains were selectively removed by oxygen plasma etching, and the line-edge roughness (LER) was calculated from the SEM images. The $3\sigma$ LER of assembled lines gradually increased from 2.6 nm to 5.2 nm with the increase of $L_s$ from 50 nm to 80 nm, and wavy line edges were observed in the SEM images of MSM-198 films on 70-80 nm patterns. Defects, such as disconnections and dislocations of domains, were observed on patterns with $L_s$=85 nm. With the increase of $L_s$ to 90 nm, the copolymer domains no longer registered to the underlying chemical pattern, and fingerprint-like structures formed on film surfaces. Further increase of $L_s$ to 100 and 110 nm resulted in domains that were partially registered to the underlying patterned substrates, forming a structure that combined fingerprint and interpolated line structures with periods of ~50-55 nm. At $L_s \gg L_o$, the chemical pattern cannot provide sufficient energy for polymer chains to extend and align with the underlying chemical pattern, leading to the formation of fingerprint structures or interpolated line structures. MSM-198 could equilibrate on chemical patterns with $L_s$ up to 55% larger than $L_o$. The expansion ratio (about 55%) of MSM-198 on chemical patterns was significantly larger than that (about 10%) of its diblock counterpart SM-104.

Example 4

Figure 12A:
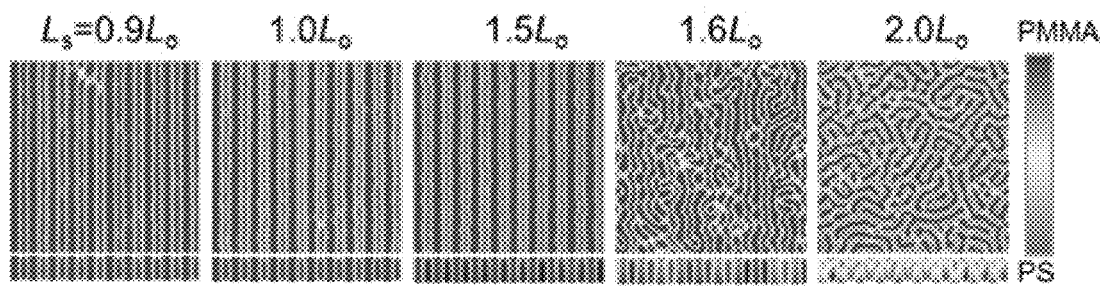
FIG. 12A shows top-down and cross-sectional maps of MSM-198 on chemical patterns with different pattern periods and 50:50 duty cycles as determined by Monte Carlo simulations.

MC Simulations of ABA Triblock Copolymers on Chemical Patterns with Ls≠Lo and Varying Duty Cycles FIG. 12A shows top-down and cross-sectional maps of MSM-198 on chemical patterns with different $L_s$ and 50:50 duty cycles as determined by MC simulations. The copolymer domains are registered on the chemical patterns and are oriented perpendicular to the substrate over a wide range of $L_s$, from 0.9 $L_o$ to 1.5 $L_o$. At $L_s$=1.6 $L_o$, defects such as necking, dislocation of domains, and fingerprint-like structures were observed on the film surfaces, in agreement with experimental observations. At $L_s$=2.0 $L_o$, registration of the copolymer domains on the chemical patterns near substrates was achieved; however, only fingerprint-like structures formed on the surfaces. In experiments, coexistence of fingerprint structures and partially aligned interpolated structures was observed.

Figure 12B:
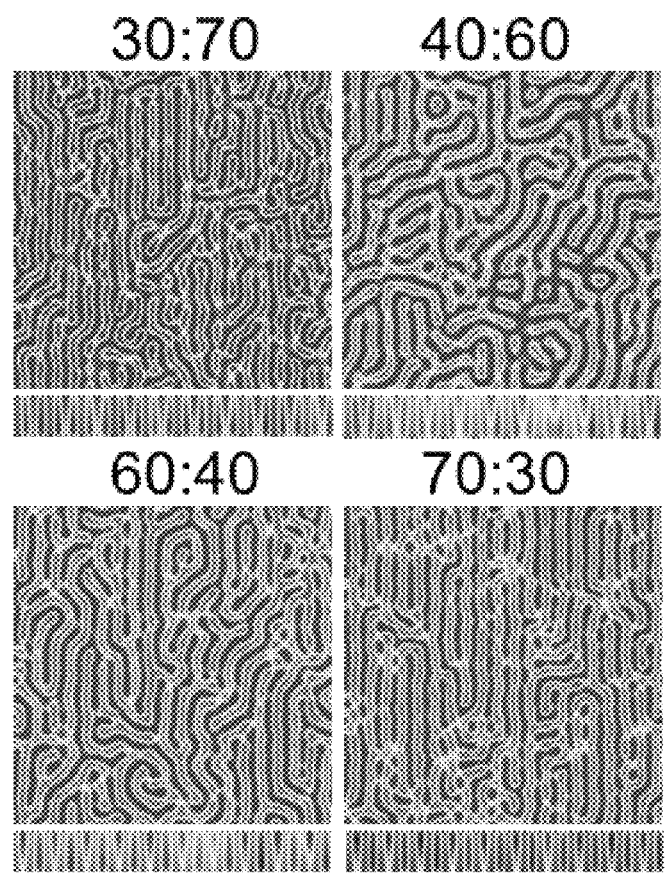
FIG. 12B shows top-down and cross-sectional maps of MSM-198 on chemical patterns with different duty cycles as determined by MC simulations.

FIG. 12B shows top-down and cross-sectional maps of MSM-198 on chemical patterns with different duty cycles as determined by MC simulations. Imperfect 2× density multiplication was observed at duty cycle 30:70 and 70:30, with the assembled structures including a mixture of fingerprints and interpolated lines.

Figure 12C:
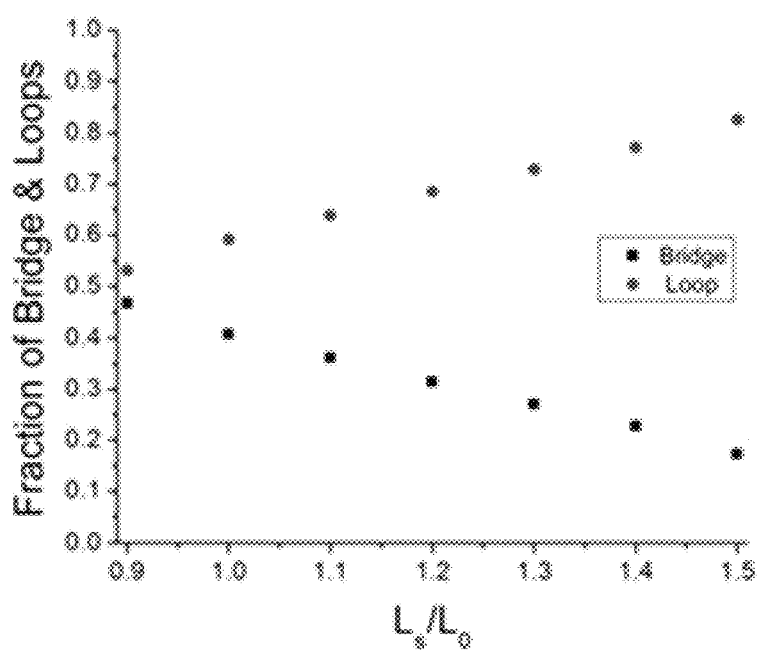
FIG. 12C shows results of calculations of bridge and loop fractions as a function of $L_s$.

The fraction of bridge and loop configurations of MSM-198 on chemical patterns in the range $L_s$=0.9-1.5 $L_o$, where directed assembly was achieved, was calculated. FIG. 12C shows the bridge and loop fractions as a function of $L_s$. The model predicts that triblock copolymers exhibit 40% of bridge structures in the bulk. On the pattern with $L_s$=1.0 $L_o$, the percentage of bridges was about 41%, which is very close to the bulk behavior. The fraction of bridges decreased with increasing $L_s$; about 17% bridge and about 83% loop configurations were obtained when $L_s$=1.5 $L_o$.

Example 5

Study of Thermodynamic and Kinetic Effects

To compare the thermodynamic stability of lamellar structures, the free energy per chain was calculated using thermodynamic integration. If the curve were not symmetric around $L_s$=1.0 $L_o$, that could explain the difference in the assembly behaviors between AB and ABA copolymers. For example, one fact that might change the symmetric dependence for AB diblocks to an asymmetric free-energy vs $L_s$ curve for ABA triblocks is the presence of bridge and loop structures in ABA triblocks, i.e. the presence of bridge and loop structures changes the slope of the free energy curve at $L_s \neq L_o$.

For these calculations, a system size of $L_x$=16.7 $L_o$, $L_y$=1.7 $L_o$ and $L_z$=1 $L_o$ was used so that a number of expanded and contracted domains could be accommodated within the same box size. FIG. 10A, discussed above, shows the free energy difference in ln $k_B$T/diblock-chain on chemical patterns with various $L_s$. The free energy plot is symmetric and similar to that of the diblock copolymer system, also shown in FIG. 10A. As discussed above, this result suggest that there are no thermodynamic driving forces that would cause a broader or asymmetric range of $L_s$ exhibiting expanded lamellar structures in the triblock versus that observed in the diblock. For directed assembly, the chemical difference between patterned stripes provides the driving force to directed assembly of block copolymer domains. The driving force should be the same at different pattern periods; however, the experimentally observed assembly behaviors of MSM-198 on chemical patterns with different $L_s$ is in contradiction to the symmetry of the free energy plot. These observations suggest that the observed lamellar morphologies at large $L_s$ correspond to kinetically trapped, metastable states.

Figure 10B:
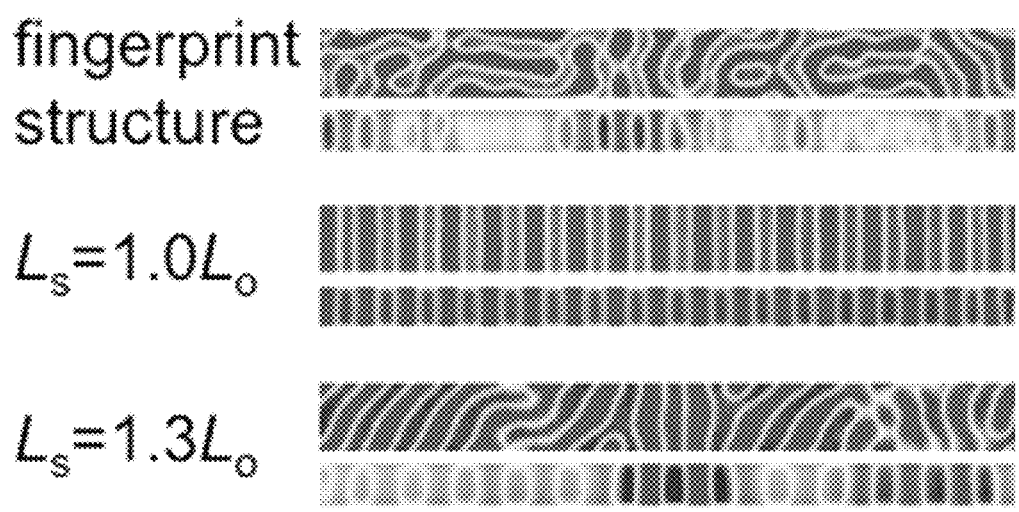
FIG. 10B shows results for simulations of annealing an ABA triblock copolymer on a chemical pattern using a fingerprint structure as a starting configuration.

MC simulations were used to explore whether kinetic instead of thermodynamic effects are behind the formation of structures at $L_s \neq L_o$ especially for $L_s$>1.2 $L_o$. The disordered system (with same system size as above) was first allowed to evolve into an ordered structure in the absence of the chemical pattern. Consistent with experiments, a fingerprint structure was observed. This structure was then used as a starting configuration for simulations on chemical patterns, with various values of $L_s$, in which the morphology was allowed to evolve. For 0.9 $L_o \leq L_s \leq$ 1.2 $L_o$, the fingerprint structure evolved into the aligned line structure identical to that obtained when a disordered state was used as a starting configuration (see FIG. 12A). For $L_s$>1.2 $L_o$, however, that the structures were different than those shown in FIG. 12A, e.g., for $L_s$=1.3 $L_o$ no perfectly registered structure was observed as illustrated in FIG. 10B. Free energy calculations using thermodynamic integration were subsequently used on these structures, and it was found that for $L_s$>1.2 $L_o$, their free energy was lower (i.e., thermodynamically more stable) than that of morphologies observed when the system is quenched from a disordered state on a chemically patterned substrate (as shown in FIG. 12A), reinforcing the view that the registered lamellar morphologies observed for $L_s$>1.2 $L_o$ (in both experiments and simulations) represent kinetically trapped, non-equilibrium states.

Example 6

Directed Assembly on Chemical Patterns Including Bends

The assembly of MSM-198 into bend geometries, an essential geometry for the fabrication of many integrated circuits, was directed and compared with the diblock copolymer SM-104. For bends with $L_s$=50 nm the effective periods at the bend corners ($L_c$) were 54.1, 70.7, and 130.7 nm for 135°, 90°, and 45° bends, respectively. Thin films (about 50 nm thickness) of MSM-198 and SM-104 were deposited on two identical chemical patterns and annealed at 230° C. for 24 hrs under vacuum. FIG. 7, discussed above, shows the SEM images of MSM-198 and SM-104 films assembled on chemical patterns with bend geometries. In experiment and simulation, defect-free assembly of MSM-198 domains at corners was achieved on bends with 135° and 90° angles, while disconnected or mismatched domains formed at the corners of patterns with 45° angles. For the assembly of SM-104, dislocations of domains were observed at corners on 90° and 45° bends. Annealing time was extended to 3 days and 7 days, and defect structures remained. The effective periods at the corners are significantly larger than the natural period of the block copolymers, the polymer chains expand at a great extent to achieve defect-free assembly. It is believed that the difference in the assembly behaviors between the AB diblock and the ABA triblock on 90° bends and on patterns with $L_s \neq L_o$ is a result of the surprisingly large expansion ratio of MSM-198 on chemical patterns.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

The invention claimed is:

1. A structure comprising a thin film overlying a pattern, wherein the thin film comprises microphase-separated domains of an ABA triblock copolymer and wherein the pattern is replicated throughout the thickness of the thin film, wherein the ABA triblock copolymer has a bulk period $L_o$ and the pattern has a period $L_s$ that is greater than or equal to about 1.2 $L_o$.

2. The structure of claim 1, wherein the ABA triblock copolymer includes a component polymer selected from the group consisting of polyethylene oxide (PEO), polydimethylsiloxane (PDMS), poly-2-vinylpyridine (P2PV), polystyrene (PS), and polymethylmethacrylate (PMMA).

3. The structure of claim 1, wherein the ABA triblock copolymer has a bulk period $L_o$ and the pattern has a period $L_s$ that is greater than or equal to about 1.4 $L_o$.

4. The structure of claim 1, wherein the pattern has a period $L_s$ and includes one or more features having effective pattern periods of at least ±1.2 $L_s$.

5. The structure of claim 1, wherein the pattern has a period $L_s$ and includes one or more features having effective pattern periods of at least ±1.4 $L_s$.

6. The structure of claim 1, wherein a ratio of A and B domain widths in the thin film is between about 1.5 and 2.

7. The structure of claim 1, wherein a duty cycle of the pattern is between about 20:80 and 40:60.

8. The structure of claim 1, wherein the thin film overlies a chemically patterned surface.

9. The structure of claim 1, wherein the thickness of the thin films is at least 0.5 $L_O$.

10. A structure comprising a thin film overlying a pattern having a pattern period $L_s$, wherein the thin film comprises microphase-separated domains of a block copolymer material that has a bulk period $L_o$, the pattern is replicated throughout the thickness of the thin film and $L_s$ is at least about 1.4 $L_o$.

11. The structure of claim 10, wherein the block copolymer material comprises an ABA block copolymer.

12. The structure of 11, wherein the ABA triblock copolymer includes a component polymer selected from the group consisting of polyethylene oxide (PEO), polydimethylsiloxane (PDMS), poly-2-vinylpyridine (P2PV), polystyrene (PS), and polymethylmethacrylate (PMMA).

13. The structure of claim 10, wherein the block copolymer material is without a homopolymer.

14. A structure comprising a thin film overlying a pattern having a pattern geometry and pattern period $L_s$, wherein the thin film comprises microphase-separated domains of a block copolymer material that has a bulk period $L_o$ and a bulk morphology geometry that corresponds to the pattern geometry, wherein the pattern is replicated in the thin film and $L_s$ is at least about 1.4 $L_o$.

15. The structure of claim 14, wherein the block copolymer material comprises an ABA block copolymer.

16. The structure of claim 14, wherein the block copolymer material is without a homopolymer.

17. The structure of claim 14, wherein the pattern includes one or more features having effective pattern periods of at least ±1.2 $L_s$.

18. The structure of claim 15, wherein a ratio of A and B domain widths in the thin film is between about 1.5 and 2.

19. The structure of claim 14, wherein the thin film overlies a chemically patterned surface.

\* \* \* \* \*